United States Patent
Kikuchi et al.

(10) Patent No.: US 8,362,817 B2
(45) Date of Patent: Jan. 29, 2013

(54) PHASE COMPARATOR AND CLOCK DATA RECOVERY CIRCUIT

(75) Inventors: Hidekazu Kikuchi, Kanagawa (JP); Hideo Morohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/137,566

(22) Filed: Aug. 26, 2011

(65) Prior Publication Data

US 2012/0081152 A1  Apr. 5, 2012

(30) Foreign Application Priority Data

Oct. 1, 2010 (JP) ................. 2010-223836

(51) Int. Cl.
*H03L 7/00* (2006.01)
*G01R 25/00* (2006.01)

(52) U.S. Cl. ............. 327/157; 327/3; 327/12; 327/147; 327/148; 327/156; 331/17; 331/25; 375/374; 375/376

(58) Field of Classification Search .......... 327/2, 3, 327/5, 7–10, 12, 147, 148, 156, 157; 331/17, 331/25; 375/373, 374, 376
See application file for complete search history.

(56) References Cited

U.S. PATENT DOCUMENTS

| 6,496,042 | B1 * | 12/2002 | Nishikawa | 327/2 |
| 6,633,184 | B2 * | 10/2003 | Idei et al. | 327/12 |
| 7,088,796 | B2 * | 8/2006 | Djahanshahi et al. | 375/376 |
| 7,151,814 | B1 * | 12/2006 | Kong et al. | 375/376 |
| 2010/0264963 | A1 * | 10/2010 | Kikuchi et al. | 327/157 |

* cited by examiner

*Primary Examiner* — Patrick O'Neill
(74) *Attorney, Agent, or Firm* — Rader, Fishman & Grauer PLLC

(57) ABSTRACT

The present disclosure provides a phase comparator including, a first latch, a second latch, a first detection circuit, a second detection circuit, and a charge-pump circuit having the function of a changeover switch.

10 Claims, 15 Drawing Sheets

PHASE COMPARATOR AND CLOCK DATA RECOVERY CIRCUIT

BACKGROUND

The present disclosure relates to a Hodge-type phase detector and a clock data recovery circuit making use of the Hogge-type phase detector. In the following description, the technical term "phase detector" is used to imply the same meaning as the technical term "phase comparator."

FIG. 1 is a block diagram showing a CDR (Clock Data Recovery) circuit 10 provided with a Hogge-type phase detector 11 to serve as a circuit designed for an irregular NRZ (Non-Return-to-Zero) signal (see Hogge, CP etc., "A Self Correcting Clock Recovery Circuit," Journal of Lightwave Technology, LT 3$^{rd}$ Volume, No. 6, December 1985, p. 1312-1314).

As shown in the figure, the CDR circuit 10 employs the Hogge-type PD (Phase Detector) 11, CPs (Charge Pumps) 12 and 13, a LF (Loop Filter 14) and a VCO (Voltage-Controlled Oscillator) 15.

The Hogge-type phase detector 11 has a first DFF (D-type Flip-Flop) 11a for inputting input data IDT, which is NRZ data, synchronously with an ECCK (Eye Center Clock) signal and outputting a signal Q1.

In addition, the Hogge-type phase detector 11 also has a second DFF 11b for inputting the signal Q1 synchronously with an EECK (Eye Edge Clock) signal having a phase opposite to the phase of the ECCK signal and outputting a signal Q2.

On top of that, the Hogge-type phase detector 11 also has a first EXOR (exclusive logical sum) circuit 11c for detecting logic mismatching of the input data IDT and the signal Q1 output by the first DFF 11a. In addition, the Hogge-type phase detector 11 also has a second EXOR circuit 11d for detecting logical mismatching of the signal Q1 output by the first DFF 11a and the signal Q2 output by the second DFF 11b.

On top of that, the Hogge-type phase detector 11 also has a buffer 11e for supplying a clock signal CLK output by the VCO 15 to the first DFF 11a as the eye center clock signal ECCK and an inverter 11f for supplying the clock signal CLK output by the VCO 15 to the second DFF 11b as the eye edge clock signal EECK.

A signal output by the first EXOR circuit 11c as an up signal UP drives a charge pump (CP+) 12 for charging electrically a current to the LF 14. On the other hand, a signal output by the second EXOR circuit 11d as a down signal DOWN drives a charge pump (CP−) 13 for discharging electrically a current from the LF 14.

The LF 14 integrates and smoothes currents output and input by the charge pumps 12 and 13 in order to generate a signal input supplied to the VCO 15.

The VCO 15 generates the aforementioned clock signal CLK having a frequency determined by the signal input to the VCO 15. The clock signal CLK is output by the CDR circuit 10 as a recovered clock signal RCCK whereas the signal Q1 generated by the first DFF 11a is output by the CDR circuit 10 as a retimed data signal RTDT.

FIG. 2 shows timing charts of operations carried out by the Hogge-type phase detector 11.

The up signal UP generated by the first EXOR circuit 11c is sustained at a high level during a period between times t1 and t2. The time t1 is a time at which the NRZ data serving as the input data IDT is set up. On the other hand, the time t2 is a time at which the first DFF 11a inputs the input data IDT and outputs the input data IDT as output data Q1 on the rising edge of the eye center clock signal ECCK.

The length of the period of (t2−t1) shows how much the eye center clock signal ECCK is delayed from the setting-up of the input data IDT. That is to say, the length of the period of (t2−t1) is an analog quantity representing a relative phase between the input data IDT and the clock signal CLK generated by the VCO 15.

The down signal DOWN generated by the second EXOR circuit 11d is sustained at a high level during a period between the time t2 and a time t3. As described above, the time t2 is a time at which the output data Q1 is set up by the first DFF 11a. On the other hand, the time t3 is a time at which the second DFF 11b inputs the output data Q1 and outputs the output data Q1 as output data Q2 on the rising edge of the eye edge clock signal EECK.

The pulse width of (t3−t2) of the down signal DOWN is always equal to half the period of the clock signal CLK generated by the VCO 15.

When the CDR loop has settled down in a steady state, on the average, there is established a state of time balance between electrical charging by the up signal UP to the LF 14 and electrical discharging by the down signal DOWN from the LF 14.

Thus, if the absolute value of a current generated by the charge pump (CP+) 12 is equal to the absolute value of a current generated by the charge pump (CP−) 13, the phase of the clock signal CLK generated by the VCO 15 is locked so that the high-pulse width of the up signal UP is equal to the high-pulse width of the down signal DOWN.

Accordingly, the pulse width of the up signal UP is equal to the pulse width of the down signal DOWN and both the pulse widths are equal to half the period of the clock signal CLK generated by the VCO 15. In addition, the rising edge of the eye center clock signal ECCK is locked at the a location separated from the setting-up of the input data IDT by a period equal to half the period of the clock signal CLK generated by the VCO 15. That is to say, the rising edge of the eye center clock signal ECCK is locked in the middle of the NRZ data.

SUMMARY

In the CDR circuit 10 described above, however, it is feared that errors are generated in the up signal UP generated by the first EXOR circuit 11c and the down signal DOWN generated by the second EXOR circuit 11d.

The up signal UP generated by the first EXOR circuit 11c and the down signal DOWN generated by the second EXOR circuit 11d are signals for switching the charge-pump circuits 12 and 13. Thus, if errors are generated in the up signal UP generated by the first EXOR circuit 11c and the down signal DOWN generated by the second EXOR circuit 11d, the higher the speed of the operation, the larger the effect of the errors. As a result, the CDR circuit 10 has a demerit that the charge-pump circuits 12 and 13 do not function.

This problem is further described as follows.

FIG. 3 is a circuit diagram showing a typical configuration of an EXOR circuit and a charge-pump circuit which are employed in the CDR circuit 10 shown in FIG. 1.

As shown in the figure, the EXOR circuit is configured to employ PMOS (P-channel MOS) transistors PT1 to PT4, NMOS (N-channel MOS) transistors NT1 to NT4, inverters INV1 and INV2 as well as an output node ND1.

Two input signals A and B are supplied to the EXOR circuit shown in FIG. 3. In the case of the first EXOR circuit 11c employed in the CDR circuit 10 shown in FIG. 1, the input signal A is the input data IDT whereas the signal B is the output data Q1 output by the first DFF 11a. In the case of the second EXOR circuit 11d employed in the CDR circuit 10 shown in FIG. 1, on the other hand, the input signal A is the signal Q1 output by the first DFF 11a whereas the signal B is the signal Q2 output by the second DFF 11b.

In the EXOR circuit, the sources of the PMOS transistors PT1 and PT2 are connected to a power-supply electric-potential line VDD whereas the sources of the NMOS transistors NT1 and NT2 are connected to a reference electric-potential line VSS.

The drain of the PMOS transistor PT1 is connected to the source of the PMOS transistor PT3 whereas the drain of the PMOS transistor PT3 is connected to the output node ND1. The drain of the PMOS transistor PT2 is connected to the source of the PMOS transistor PT4 whereas the drain of the PMOS transistor PT4 is connected to the output node ND1.

The drain of the NMOS transistor NT1 is connected to the source of the NMOS transistor NT3 whereas the drain of the NMOS transistor NT3 is connected to the output node ND1. The drain of the NMOS transistor NT2 is connected to the source of the NMOS transistor NT4 whereas the drain of the NMOS transistor NT4 is connected to the output node ND1.

The inverter INV1 outputs an inverted input signal XA which is a signal obtained by inverting the input signal A. By the same token, the inverter INV2 outputs an inverted signal XB which is a signal obtained by inverting the signal B.

The input signal A is supplied to the gate of the PMOS transistor PT1 whereas the inverted input signal XA of the input signal A is supplied to the gate of the PMOS transistor PT2. On the other hand, the inverted signal XB of the signal B is supplied to the gate of the PMOS transistor PT3 whereas the signal B is supplied to the gate of the PMOS transistor PT4.

The signal B is supplied to the gate of the NMOS transistor NT1 whereas the inverted signal XB of the signal B is supplied to the gate of the NMOS transistor NT2. On the other hand, the input signal A is supplied to the gate of the NMOS transistor NT3 whereas the inverted input signal XA of the input signal A is supplied to the gate of the NMOS transistor NT4.

The EXOR circuit detects logic mismatching of the input signals A and B, outputting the up signal UP or the down signal DOWN to the charge-pump circuit.

The charge-pump circuit 12 (or 13) is configured to employ a PMOS transistor PT5 serving as a switch, an NMOS transistor NT5, current sources I1 and I2, an inverter INV3 as well as an output node ND2.

The source of the PMOS transistor PT5 is connected to the power-supply electric-potential line VDD whereas the drain of the PMOS transistor PT5 is connected to the current source I1. The output of the current source I1 is connected to the output node ND2.

By the same token, the source of the NMOS transistor NT5 is connected to the reference electric-potential line VSS whereas the drain of the NMOS transistor NT5 is connected to the current source I2. The output of the current source I2 is also connected to the output node ND2.

In addition, the inverted signal of the up signal UP is supplied to the gate of the PMOS transistor PT5 by way of the inverter INV3 whereas the down signal DOWN is supplied to the gate of the NMOS transistor NT5.

Since the EXOR circuit shown in FIG. 3 fetches an output by a voltage pulse, the circuit is not capable of outputting a pulse having a width equal to or smaller than a minimum pulse width determined by the ratio C/gm of the gate of the transistor as shown in FIG. 4A where notation C denotes the capacitance.

Thus, as the difference in phase between the input signals A and B becomes close to 0 or close to 1T representing 1 period, the pulse width is undesirably pulled down to 0 or pulled up to 1 respectively as shown in FIG. 4B so that there is raised a problem that the linearity of the relation between the pulse width and the difference in phase can be deteriorated.

In addition, the EXOR circuit shown in FIG. 3 requires the inverted input signal XA having a phase opposite to the phase of the input signal A and the inverted signal XB having a phase opposite to the phase of the signal B. As shown in FIG. 5, generated from the input signal A by making use of the inverter INV1, the inverted input signal XA is delayed from the input signal A by a delay time corresponding to the propagation of the signal A through the inverter INV1. By the same token, generated from the signal B by making use of the inverter INV2, the inverted signal XB is delayed from the signal B by a delay time corresponding to the propagation of the signal B through the inverter INV2. Thus, the width of a pulse formed by making use of the input signal A and the inverted signal XB may be undesirably unequal to the width of a pulse formed by making use of the signal B and the inverted input signal XA.

The higher the speed of the operation, the larger the difference in width between the pulses and, hence, the more serious the problem can be raised by the difference.

As shown in FIG. 3, a signal output by the EXOR circuit is used as the up signal UP or the down signal DOWN for switching the charge-pump circuit. Thus, an error is generated between the up signal UP and the down signal DOWN and, the higher the speed of the operation, the bigger the effect of the error. When a big effect is caused by the error, it becomes impossible to turn on and off the PMOS transistor PT5 and the NMOS transistor NT5 which are each used as a switch. As a result, the function of the charge-pump circuit is inevitably lost.

It is thus an embodiment of the present disclosure to provide a phase comparator capable of operating a switch for switching a current from an electrical charging current to an electrical discharging current and vice versa with absolute certainty, capable of keeping up with high operation speeds and capable of sustaining the functions of a charge-pump circuit and provide a clock data recovery circuit employing the phase comparator.

A phase comparator according to a first embodiment of the present disclosure includes:

a first latch configured to latch input data synchronously with an eye center clock signal;

a second latch configured to latch the data latched in the first latch synchronously with an eye edge center clock signal having a phase opposite to the phase of the eye center clock signal;

a first detection circuit configured to detect logical mismatching of the input data and the data latched in the first latch;

a second detection circuit configured to detect logical mismatching of the data latched in the first latch and the data latched in the second latch; and a charge-pump circuit having the function of a changeover switch configured to change a current generated by the charge-pump circuit from an electrical charging current to an electrical discharging current and vice versa on the basis of logical-mismatching detection results produced by the first and second detection circuits, wherein the first detection circuit, the second detection circuit and the charge-pump circuit are formed as a mismatching-detector/charge-pump compound circuit which is a compound circuit including logical-mismatching determination sections of the first and second detection circuits and including the changeover switch configured to change the current from the electrical charging current of the charge-pump circuit to the electrical discharging current of the charge-pump circuit and vice versa.

A clock data recovery circuit according to a second embodiment of the present disclosure has:

a phase comparator configured to detect a difference in phase between input data and an extracted clock signal and outputting an analog quantity according to the difference in phase;

a loop filter configured to integrate and smoothing a signal output by the phase comparator; and a voltage-controlled oscillator configured to generate the clock signal by oscillation at a frequency according to a signal output by the loop filter and supplying the clock signal to the phase comparator, wherein the phase comparator includes:

a first latch configured to latch the input data synchronously with an eye center clock signal (derived from the clock signal);

a second latch configured to latch the data latched in the first latch synchronously with an eye edge center clock signal (derived from the clock signal to serve as a clock signal) having a phase opposite to the phase of the eye center clock signal;

a first detection circuit configured to detect logical mismatching of the input data and the data latched in the first latch;

a second detection circuit configured to detect logical mismatching of the data latched in the first latch and the data latched in the second latch; and a charge-pump circuit having the function of a changeover switch configured to change a current output by the charge-pump circuit to the loop filter from an electrical charging current to an electrical discharging current and vice versa on the basis of logical-mismatching detection results produced by the first and second detection circuits, and the first detection circuit, the second detection circuit and the charge-pump circuit are formed as a mismatching-detector/charge-pump compound circuit which is a compound circuit including logical-mismatching determination sections of the first and second detection circuits and including the changeover switch configured to change the current from the electrical charging current of the charge-pump circuit to the electrical discharging current of the charge-pump circuit and vice versa.

In accordance with the present disclosure, it is possible to suppress a reduction of a signal receiving margin for an abrupt phase change of the input data and suppress an increase of the erroneous-signal receiving probability.

DETAILED DESCRIPTION OF THE PREFERRED EMBODIMENTS

Embodiments of the present disclosure are explained below by referring to the diagrams. It is to be noted that the embodiments are described in chapters arranged as follows.

1: First Embodiment (First Typical Configuration of the CDR Circuit)
2: Second Embodiment (Second Typical Configuration of the CDR Circuit)

<1. First Embodiment>

Figure 6:
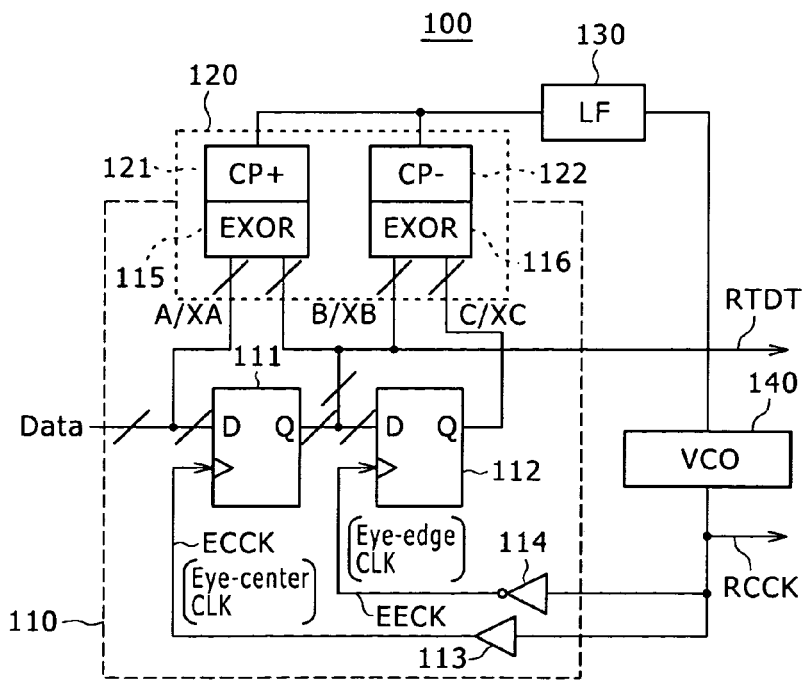
FIG. 6 is a diagram showing the configuration of a CDR circuit according to a first embodiment of the present disclosure.

FIG. 6 is a diagram showing the configuration of a CDR circuit 100 according to the first embodiment of the present disclosure.

As shown in FIG. 6, the CDR circuit 100 according to the first embodiment employs a Hogge-type phase detector 110, an EXOR/charge-pump compound circuit 120 serving as a compound circuit, an LF (Loop Filter) 130 and a VCO (Voltage-Controlled Oscillator) 140.

In the CDR circuit 100 according to the first embodiment, EXOR circuits are integrated with a changeover switch of every charge-pump circuit to form the EXOR/charge-pump compound circuit 120. The EXOR circuits are circuits for generating respectively an up signal UP and a down signal DOWN from the Hogge-type phase detector 110. The up signal UP is an electrical charging current of a specific one of the charge-pump circuits whereas the down signal DOWN is an electrical discharging current of the other one of the charge-pump circuits. The changeover switches are each a switch for changing the current generated from the Hogge-type phase detector 110 from the up signal UP of the specific charge-pump circuit to the down signal DOWN of the other charge-pump circuit and vice versa.

In the Hogge-type phase detector 110 employed in the CDR circuit 100, DFFs are each configured as a DFF included in a DFF circuit for generating differential outputs having the same phase. Each of the DFF circuits provides the generated differential outputs to one of the EXOR circuits as differential inputs of the EXOR circuit.

Basically, the CDR circuit 100 according to the first embodiment has a function to extract a clock signal CLK from an irregular NRZ input signal serving as input data IDT and recover the input data IDT.

The Hogge-type phase detector 110 has a first DFF 111 serving as a first latch for inputting NRZ data serving as input data IDT and outputting data B/XB synchronously with an eye center clock signal ECCK. In FIG. 6, the input data IDT is denoted by notation A/XA.

In addition, the Hogge-type phase detector 110 also has a second DFF 112 serving as a second latch for inputting the data B/XB and outputting data C/XC synchronously with an eye edge clock signal EECK having a phase opposite to the phase of the eye center clock signal ECCK.

As described before, each of the first DFF 111 and the second DFF 112 is configured as a DFF included in a DFF circuit for generating differential outputs having the same phase.

A concrete configuration of each of the first DFF 111 and the second DFF 112 will be described in detail later.

In addition, the Hogge-type phase detector 110 also has a buffer 113 for supplying a clock signal CLK output by the VCO 140 to the first DFF 111 as the eye center clock signal ECCK and an inverter 114 for supplying the clock signal CLK output by the VCO 140 to the second DFF 112 as the eye edge clock signal EECK.

Figure 1:
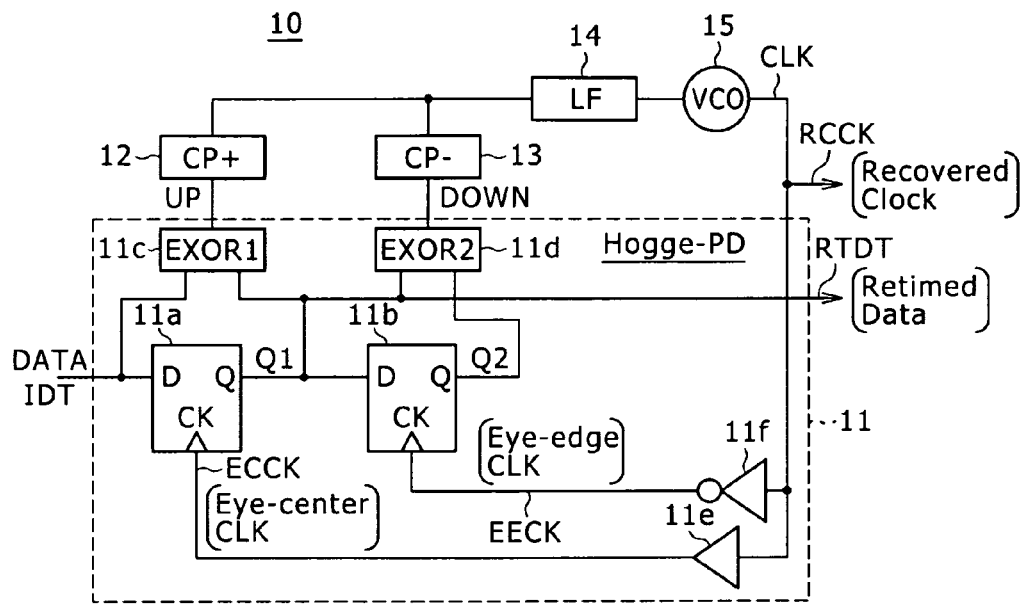
FIG. 1 is a block diagram showing a CDR (Clock Data Recovery) circuit provided with a Hogge-type phase detector to serve as a circuit for an irregular NRZ signal.
Figure 2:
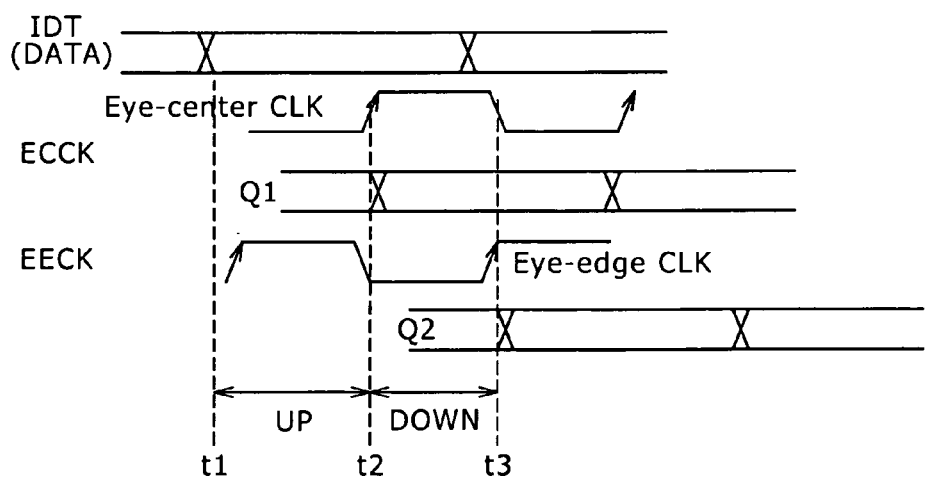
FIG. 2 shows timing charts of operations carried out by the Hogge-type phase detector.
Figure 3:
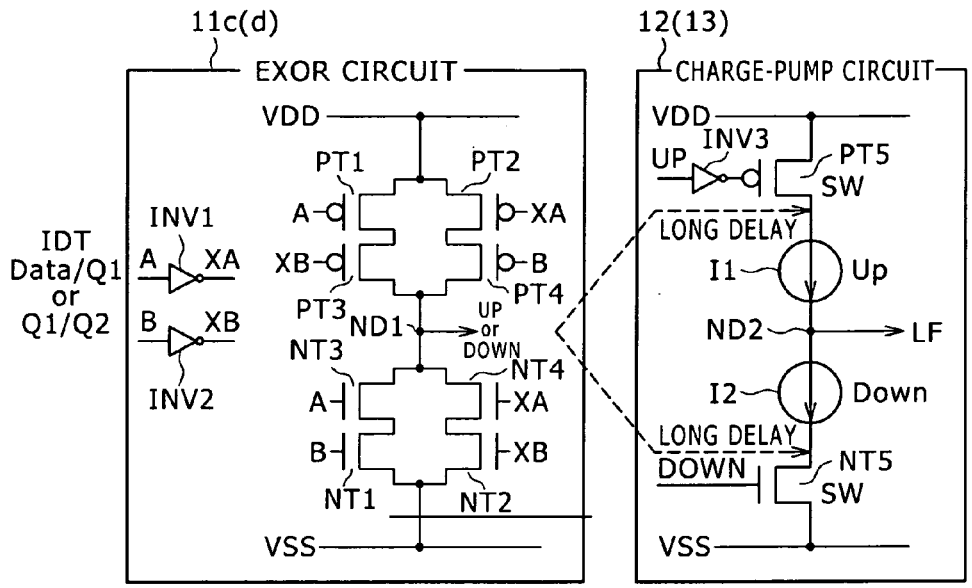
FIG. 3 is a circuit diagram showing a typical configuration of an EXOR circuit and a charge-pump circuit that are employed in the CDR circuit shown in FIG. 1.
Figure 4A:
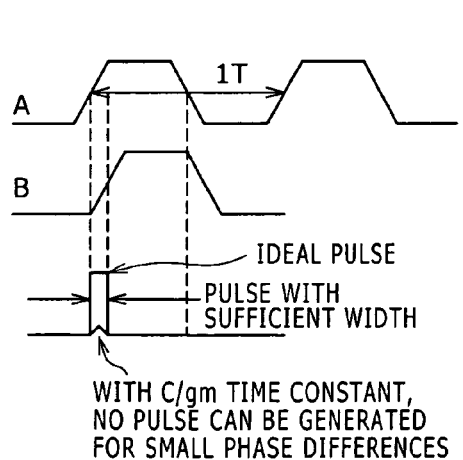
FIGS. 4A and 4B are diagrams to be referred to in description of problems raised by the EXOR circuit.
Figure 4B:
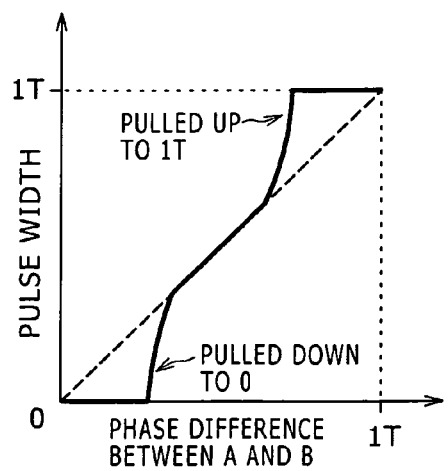
Figure 5:
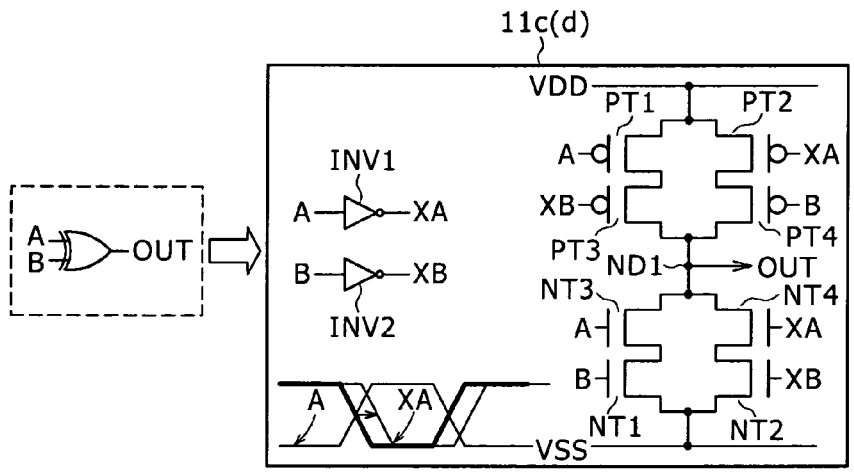
FIG. 5 is an explanatory diagram to be referred to in description of a problem.

In general, similarly to the Hogge-type phase detector 110 employed in the CDR circuit 10 shown in FIG. 1, the Hogge-type phase detector 110 is configured to include a first EXOR circuit 115 serving as a first logical-mismatching detection circuit and a second EXOR circuit 116 serving as a second logical-mismatching detection circuit.

The first EXOR circuit 115 detects the logical mismatching of the input data IDT denoted by notation A/XA and the data B/XB output by the first DFF 111. On the other hand, the second EXOR circuit 116 detects the logical mismatching of the data B/XB output by the first DFF 111 and the data C/XC output by the second DFF 112.

A signal output by the first EXOR circuit 115 as an up signal UP drives a charge pump (CP+) 121 for charging electrically a current to the LF 130. On the other hand, a signal output by the second EXOR circuit 116 as a down signal DOWN drives a charge pump (CP−) 122 for discharging electrically a current from the LF 130.

The LF 130 integrates and smoothes currents output and input by the charge pumps 121 and 122 in order to generate a signal input to the VCO 140.

The VCO 140 generates the aforementioned clock signal CLK having a frequency determined by the signal input to the VCO 140. The clock signal CLK is output by the CDR circuit 100 as a recovered clock signal RCCK whereas the signal B/XB generated by the first DFF 111 is output by the CDR circuit 100 as a retimed data signal RTDT.

In the CDR circuit 100 according to the first embodiment, as described above, the EXOR circuits 115 and 116 are integrated with a changeover switch of the charge-pump circuits 121 and 122 to form the EXOR/charge-pump compound circuit 120. The EXOR circuits 115 and 116 are circuits for generating an up signal UP and a down signal DOWN respectively from the Hogge-type phase detector 110. The up signal UP is an electrical charging current of the charge-pump circuit 121 and the down signal DOWN is an electrical discharging current of the other charge-pump circuit 122. The changeover switch is a switch for changing the current generated from the Hogge-type phase detector 110 from the up signal UP to the down signal DOWN and vice versa.

In the Hogge-type phase detector 110 employed in the CDR circuit 100, the DFFs 111 and 112 are each configured as a DFF included in a DFF circuit for generating differential outputs having the same phase. Each of the DFF circuits 111 and 112 provides the generated differential outputs to one of the EXOR circuits 115 and 116 as differential inputs of the EXOR circuit.

The following description explains the concrete configuration of the EXOR/charge-pump compound circuit 120 serving as a compound circuit as well as the concrete configuration of each of the DFF circuits each used for generating differential outputs having the same phase and explains functions carried out by the EXOR/charge-pump compound circuit 120 as well as functions carried out by the DFF circuits.

Figure 7:
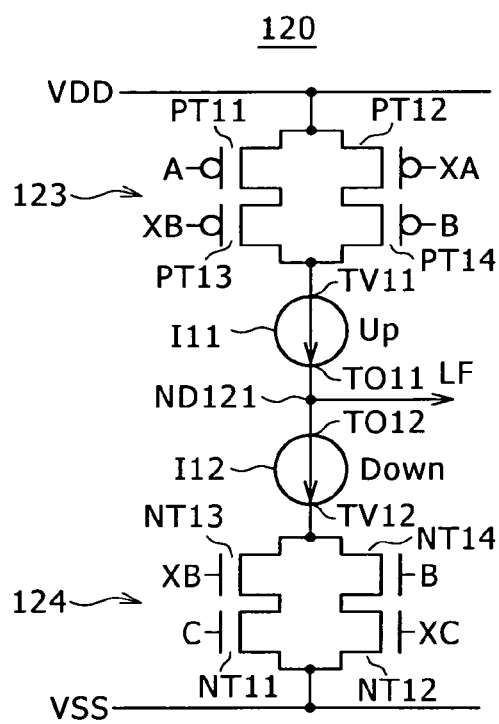
FIG. 7 is a circuit diagram showing a typical configuration of an EXOR/charge-pump compound circuit according to the first embodiment of the present disclosure.

FIG. 7 is a circuit diagram showing a typical configuration of the EXOR/charge-pump compound circuit 120 according to the first embodiment of the present disclosure.

As shown in the figure, the EXOR/charge-pump compound circuit 120 is configured to employ PMOS transistors PT11 to PT14, NMOS transistors NT11 to NT14, a first current source I11, a second current source I12 and an output node ND121.

The PMOS transistors PT11 to PT14 function as a logical-mismatching determination section of the first EXOR circuit 115 and also function as a changeover switch of the first charge-pump circuit 121. The PMOS transistors PT11 to PT14 form a first compound section 123.

On the other hand, the NMOS transistors NT11 to NT14 function as a logical-mismatching determination section of the second EXOR circuit 116 and also function as a changeover switch of the second charge-pump circuit 122. The NMOS transistors NT11 to NT14 form a second compound section 124.

In this embodiment, the p channel corresponds to the first-conduction type whereas the n channel corresponds to the second-conduction type. Thus, in this embodiment, a PMOS transistor is an FET (Field Effect Transistor) of the first-conduction type whereas an NMOS transistor is an FET of the second-conduction type.

To be more specific, the PMOS transistors PT11 to PT14 are respectively the first, second, third and fourth FETs of the first-conduction type.

On the other hand, the NMOS transistors NT11 to NT14 are respectively the first, second, third and fourth transistors of the second-conduction type.

In the EXOR/charge-pump compound circuit 120, the sources of the PMOS transistors PT11 and PT12 are connected to a power-supply electric-potential line VDD whereas the sources of the NMOS transistors NT11 and NT12 are connected to a reference electric-potential line VSS.

The drain of the PMOS transistor PT11 is connected to the source of the PMOS transistor PT13 whereas the drain of the PMOS transistor PT13 is connected to a power-supply side terminal TV11 of the first current source I11. The drain of the PMOS transistor PT12 is connected to the source of the PMOS transistor PT14 whereas the drain of the PMOS transistor PT14 is connected to the power-supply side terminal TV11 of the first current source I11.

The drain of the NMOS transistor NT11 is connected to the source of the NMOS transistor NT13 whereas the drain of the NMOS transistor NT13 is connected to a reference-line side terminal TV12 of the second current source I12. The drain of the NMOS transistor NT12 is connected to the source of the NMOS transistor NT14 whereas the drain of the NMOS transistor NT14 is connected to the reference-line side terminal TV12 of the second current source I12.

An input signal A representing the input data IDT is supplied to the gate of the PMOS transistor PT11 whereas an inverted input signal XA of the input signal A is supplied to the gate of the PMOS transistor PT12. The inverted input signal XA is a signal having a phase opposite to the phase of the input signal A. On the other hand, the inverted signal XB of an signal B output by the first DFF 111 is supplied to the gate of the PMOS transistor PT13 whereas the signal B is supplied to the gate of the PMOS transistor PT14. Likewise, the inverted signal XB is a signal having a phase opposite to the phase of the signal B.

An output signal C output by the second DFF 112 is supplied to the gate of the NMOS transistor NT11 whereas the inverted output signal XC of the output signal C is supplied to the gate of the NMOS transistor NT12. Likewise, the inverted output signal XC is a signal having a phase opposite to the phase of the output signal C. On the other hand, the inverted signal XB is supplied to the gate of the NMOS transistor NT13 whereas the signal B is supplied to the gate of the NMOS transistor NT14.

An output side terminal TO11 of the first current source I11 is connected to the output node ND121 whereas an output side terminal TO12 of the second current source I12 is connected to the output node ND121.

In the EXOR/charge-pump compound circuit 120, when the input signal A does not logically match the signal B output by the first DFF 111 for example, a current is electrically charged to the LF 130.

If the input signal A does not logically match the signal B output by the first DFF 111 because the input signal A is set at an H (high) level whereas the signal B output by the first DFF 111 is set at an L (low) level for example, the first compound section 123 operates as follows.

In the first compound section 123, since the input signal A is set at the H level and the inverted input signal XA of the input signal A is thus set at the L level, the PMOS transistor PT11 is turned off whereas the PMOS transistor PT12 is turned on. In addition, since the signal B is set at the L level and the inverted signal XB of the signal B is thus set at the H level, the PMOS transistor PT13 is turned off whereas the PMOS transistor PT14 is turned on.

Thus, the power-supply side terminal TV11 of the first current source I11 is connected to the power-supply electric-potential line VDD by the PMOS transistor PT12 and the PMOS transistor PT14. As a result, a current generated by the first current source I11 flows from the output node ND121 to the LF 130, electrically charging the LF 130.

In addition, at that time, if the signal B output by the first DFF 111 logically matches the output signal C output by the second DFF 112 because both the signal B and the output signal C are set at the L level for example, both the inverted signal XB of the signal B and the inverted output signal XC of the output signal C are set at the H level. Since the output signal C is set at the L level and the inverted output signal XC of the input signal is set at the H level, the NMOS transistor NT11 is turned off whereas the NMOS transistor NT12 is turned on. In addition, since the signal B is set at the L level and the inverted signal XB of the signal B is set at the H level, the NMOS transistor NT13 is turned on whereas the NMOS transistor NT14 is turned off.

Thus, the reference-line side terminal TV12 of the second current source I12 is not connected to the reference electric-potential line VSS. As a result, a current does not flow through the output node ND121 from the LF 130 as a current electrically discharging the LF 130.

In the EXOR/charge-pump compound circuit 120, when the signal B output by the first DFF 111 does not logically match the output signal C output by the second DFF 112 for example, a current flows from the LF 130, electrically discharging the LF 130.

If the signal B output by the first DFF 111 does not logically match the output signal C output by the second DFF 112 because the signal B is set at the H level whereas the output signal C output by the second DFF 112 is set at an L level for example, the second compound section 124 operates as follows.

In the second compound section 124, since the signal B is set at the H level and the inverted signal XB of the signal B is thus set at the L level, the NMOS transistor NT13 is turned off whereas the NMOS transistor NT14 is turned on. In addition, since the output signal C is set at the L level and the inverted output signal XC of the output signal C is thus set at the H level, the NMOS transistor NT11 is turned off whereas the NMOS transistor NT12 is turned on.

Thus, the reference-line side terminal TV12 of the second current source I12 is connected to the reference electric-potential line VSS by the NMOS transistor NT12 and the NMOS transistor NT14. As a result, a current generated by the second current source I12 flows through the output node ND121 from the LF 130, electrically discharging the LF 130.

In addition, at that time, if the input signal A logically matches the signal B output by the first DFF 111 because both the input signal A and the signal B are set at the H level for example, both the inverted input signal XA of the input signal A and the inverted signal XB of the signal B are set at the L level. Since the input signal A is set at the H level and the inverted input signal XA of the input signal A is set at the L level, the PMOS transistor PT11 is turned off whereas the PMOS transistor PT12 is turned on. In addition, since the signal B is set at the H level and the inverted signal XB of the signal B is set at the L level, the PMOS transistor PT13 is turned off whereas the PMOS transistor PT14 is turned on.

Thus, the power-supply side terminal TV11 of the first current source I11 is not connected to the power-supply electric-potential line VDD. As a result, a current does not flow through the output node ND121 to the LF 130 as a current electrically charging the LF 130.

Accordingly, in the EXOR/charge-pump compound circuit 120, when the input signal A does not logically match the signal B output by the first DFF 111, as described above, a current electrically charges the LF 130. When the signal B output by the first DFF 111 does not logically match the output signal C output by the second DFF 112, as described above, a current electrically discharges the LF 130.

In this way, in the EXOR/charge-pump compound circuit 120, the first compound section 123 is configured to include the function of the first EXOR circuit 115 and serve as a changeover switch provided for passing through the up signal UP in the first charge-pump circuit 121 as an electrical charging current whereas the second compound section 124 is configured to include the function of the second EXOR circuit 116 and serve as a changeover switch provided for passing through the down signal DOWN in the second charge-pump circuit 122 as an electrical discharging current.

Thus, in comparison with the past method for turning a switch on and off by making use of a generated voltage pulse, it is possible to obtain a current output having good linearity and, hence, apply an excellent CDR circuit to high-speed applications in which a voltage pulse having a width equal to or smaller than a minimum pulse width determined by the ratio C/gm can be output even if the difference in phase between the input signals becomes close to 0 or close to 1T.

As described above, the phases of the inverted input signal XA, the inverted signal XB and the inverted output signal XC are opposite to the phases of the input signal A, the signal B and the output signal C respectively and, in addition, unlike the past technology, the phases of the inverted input signal XA, the inverted signal XB and the inverted output signal XC are made to match each other. Thus, by designing each of the first DFF 111 and the second DFF 112 as a differential circuit, the phases of the input signal A, the signal B and the output signal C match each other as the phases of the inverted input signal XA, the inverted signal XB and the inverted output signal XC do.

Figure 8:
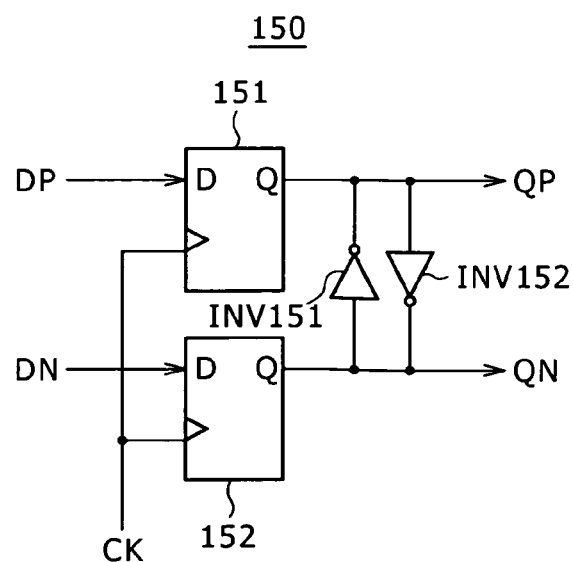
FIG. 8 is a circuit diagram showing a typical configuration of a differential DFF circuit according to the first embodiment of the present disclosure.

FIG. 8 is a circuit diagram showing a typical configuration of the differential DFF circuit 150 according to the first embodiment of the present disclosure.

In the figure showing the typical configuration of the differential DFF circuit 150, a signal representing the input data on the positive side is denoted by notation DP whereas a signal representing the input data on the negative side is denoted by notation DN. In addition, the clock signal is denoted by notation CK in place of notations ECCK and EECK.

The differential DFF circuit 150 is configured to include 2 DFF circuits, that is, a first DFF circuit 151 for receiving the input data DP and a second DFF circuit 152 for receiving the input data DN. In this configuration, the first DFF circuit 151 and the second DFF circuit 152 are laid out to form an array.

In addition, inverters INV151 and INV152 are connected to serve as cross-coupling inverters between an output line for conveying a signal QP output by the first DFF circuit 151 and an output line for conveying a signal QN output by the second DFF circuit 152. To put it in detail, the output terminal of the first inverter INV151 and the input terminal of the second inverter INV152 are connected to the output line for conveying a signal QP output by the first DFF circuit 151 from the data output terminal Q of the first DFF circuit 151. By the same token, the input terminal of the first inverter INV151 and the output terminal of the second inverter INV152 are connected to the output line for conveying a signal QN output by the second DFF circuit 152 from the data output terminal Q of the second DFF circuit 152.

As described above, the differential DFF circuit 150 shown in FIG. 8 can be implemented by laying out 2 DFF circuits 151 and 152 for receiving the input data DP and the input data DN respectively to form a parallel circuit. By further connecting the first inverter INV151 and the second inverter INV152 serving as cross-coupling inverters at the output stage, the differential balance can be improved.

The DFF circuits 151 and 152 are each a DFF circuit of the clocked-inverter type.

Figure 9:
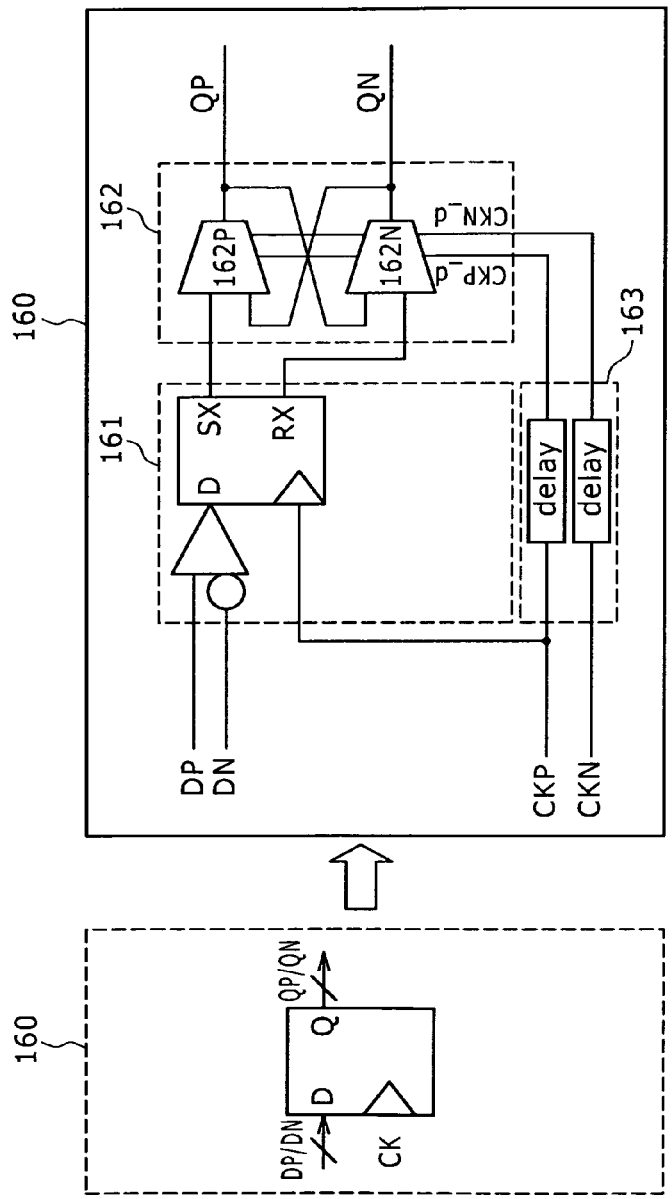
FIG. 9 is a circuit diagram showing another typical configuration of the differential DFF circuit according to the first embodiment of the present disclosure.

FIG. 9 is a circuit diagram showing a typical configuration of another differential DFF circuit 160 according to the first embodiment of the present disclosure.

The differential DFF circuit 160 shown in FIG. 9 is configured as a combination including a latched comparator circuit 161, an output selection circuit 162 and a clock delaying circuit 163.

The latched comparator circuit 161 receives differential inputs DP and DN typically in synchronization with a clock signal CKP. The latched comparator circuit 161 compares the differential inputs DP and DN with each other and carries out latching processing on the inputs DP and DN. The latched comparator circuit 161 outputs signals SX and RX representing the results of the processing to the output selection circuit 162.

The output selection circuit 162 selects held data of an output signal QN or QP and outputs the selected held data synchronously with a clock signal CKP or CKN delayed by the clock delaying circuit 163. The phase of the output signal QP is opposite to the phase of the signal SX output by the latched comparator circuit 161 whereas the phase of the output signal QN is opposite to the phase of the signal RX output by the latched comparator circuit 161.

The output selection circuit 162 has 2 output selection circuits, that is, output selection circuits 162P and 162N. The first input terminal of the first output selection section 162P receives the signal SX whereas the second input terminal of the first output selection section 162P receives a signal output by the second output selection section 162N. On the other hand, the first input terminal of the second output selection section 162N receives the signal RX whereas the second input terminal of the second output selection section 162N receives a signal output by the first output selection section 162P.

The clock delaying circuit 163 delays the clock signals CKP and CKN by typically at least a delay time equal to the time it takes to carry out the processing of the latched comparator circuit 161 and outputs the delayed clock signals CKP and CKN to the output selection circuit 162.

Figure 10:
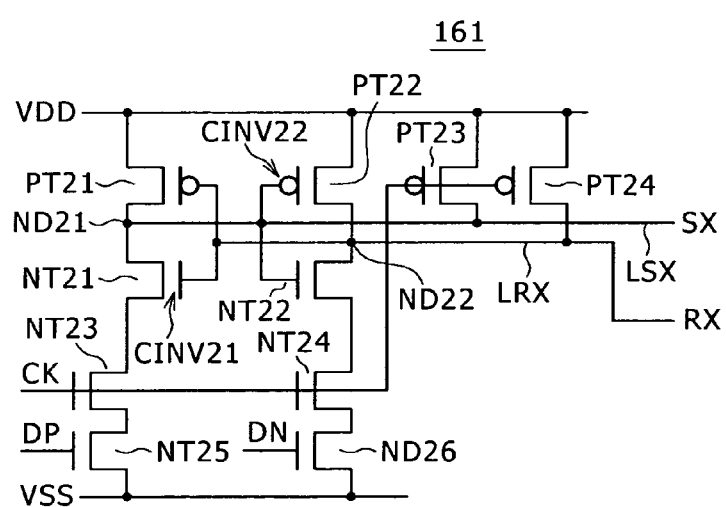
FIG. 10 is a circuit diagram showing a typical configuration of a latched comparator circuit according to the first embodiment of the present disclosure.

FIG. 10 is a circuit diagram showing a typical configuration of the latched comparator circuit 161 according to the first embodiment of the present disclosure.

As shown in FIG. 10, the latched comparator circuit 161 is configured to include PMOS transistors PT21 to PT24, NMOS transistors NT21 to NT26, a first output node ND21 and a second output node ND22.

The sources of the PMOS transistors PT21 to PT24 are connected to the power-supply electric-potential line VDD whereas the sources of the NMOS transistors NT21 to NT26 are connected to the reference electric-potential line VSS.

The drain of the PMOS transistor PT21 is connected to the drain of the NMOS transistor NT21 through a connection point serving as the first output node ND21. By the same token, the drain of the PMOS transistor PT22 is connected to the drain of the NMOS transistor NT22 through a connection point serving as the second output node ND22. The gate of the PMOS transistor PT21 and the gate of the NMOS transistor NT21 are connected to the second output node ND22 whereas the gate of the PMOS transistor PT22 and the gate of the NMOS transistor NT22 are connected to the first output node ND21.

The PMOS transistor PT21 and the NMOS transistor NT21 which are connected in this way form a CMOS inverter CINV21. On the other hand, the PMOS transistor PT22 and the NMOS transistor NT22 which are connected in this way form a CMOS inverter CINV22.

In addition, the input and output terminals of the CMOS inverter CINV21 and the CMOS inverter CINV22 are connected to each other in a cross-coupling way to form a latch. To put in detail, the input terminal of the CMOS inverter CINV21 is connected to the output terminal of the CMOS inverter CINV22 whereas the output terminal of the CMOS inverter CINV21 is connected to the input terminal of the CMOS inverter CINV22.

The source of the NMOS transistor NT21 is connected to the drain of the NMOS transistor NT23 whereas the source of the NMOS transistor NT23 is connected to the drain of the NMOS transistor NT25.

On the other hand, the source of the NMOS transistor NT22 is connected to the drain of the NMOS transistor NT24 whereas the source of the NMOS transistor NT24 is connected to the drain of the NMOS transistor NT26.

The drain of the PMOS transistor PT23 is connected to an output line LSX wired to the first output node ND21 to serve as a line for conveying the signal SX. On the other hand, the drain of the PMOS transistor PT24 is connected to an output line LRX wired to the second output node ND22 to serve as a line for conveying the signal RX.

A clock signal CK is supplied to the gates of the NMOS transistors NT23 and NT24 as well as the PMOS transistors PT23 and PT24.

A signal representing data DP is supplied to the gate of the NMOS transistor NT25 whereas a signal representing data DN is supplied to the gate of the NMOS transistor NT26.

In this latched comparator circuit 161, while the clock signal CK is being kept at the H level to form a pulse, the NMOS transistors NT23 and NT24 are sustained in a turned-on state but the PMOS transistors PT23 and PT24 are sustained in a turned-off state.

Before the clock signal CK is set at the H level, the PMOS transistors PT23 and PT24 are sustained in a turned-on state and, hence, the output line LSX for conveying the signal SX and the output line LRX for conveying the signal RX are sustained at the H level in an initialization process. As a result, the first output node ND21 and the second output node ND22 are also sustained at the H level as well. Thus, in the initial state of the latch, the PMOS transistors PT21 and PT22 are sustained in a turned-off state but the NMOS transistor NT22 is sustained in a turned-on state.

For example, let the data DP set at the H level and the data DN set at the L level be supplied to the latched comparator circuit 161 in the initial state. In this case, the NMOS transistor NT25 is turned on but the NMOS transistor NT26 is turned off.

When the NMOS transistor NT25 is put in a turned-on state, the first output node ND21 is electrically discharged to a reference electric potential level, making a transition to the L level. As a result, the PMOS transistor PT22 of the CMOS inverter CINV22 is turned on but the NMOS transistor NT22 of the CMOS inverter CINV22 is turned off. Thus, the second output node ND22 is connected to the power-supply electric-potential line VDD by the PMOS transistor PT22, being sustained stably at the power-supply electric-potential level which is the H level. When the second output node ND22 is sustained at the H level in a stable manner, the PMOS transistor PT21 of the first CMOS inverter CINV21 is turned off and sustained stably in the turned-off state but the NMOS transistor NT21 of the CMOS inverter CINV21 is turned on and sustained stably in the turned-on state.

As a result, the signal SX is output at the L level but the signal RX is output at the H level.

For example, let the data DP set at the L level and the data DN set at the H level be supplied to the latched comparator circuit 161 in the initial state. In this case, the NMOS transistor NT25 is turned off but the NMOS transistor NT26 is turned on.

When the NMOS transistor NT26 is put in a turned-on state, the second output node ND22 is electrically discharged to a reference electric potential level, making a transition to the L level. As a result, the PMOS transistor PT21 of the NMOS transistor NT21 is turned on but the NMOS transistor NT21 of the CMOS inverter CINV21 is turned off. Thus, the first output node ND21 is connected to the power-supply electric-potential line VDD by the PMOS transistor PT21, being sustained stably at the power-supply electric-potential level which is the H level. When the first output node ND21 is sustained at the H level in a stable manner, the PMOS transistor PT22 of the second CMOS inverter CINV22 is turned off and sustained stably in the turned-off state but the NMOS transistor NT22 is turned on and sustained stably in the turned-on state.

As a result, the signal SX is output at the H level but the signal RX is output at the L level.

Figure 11:
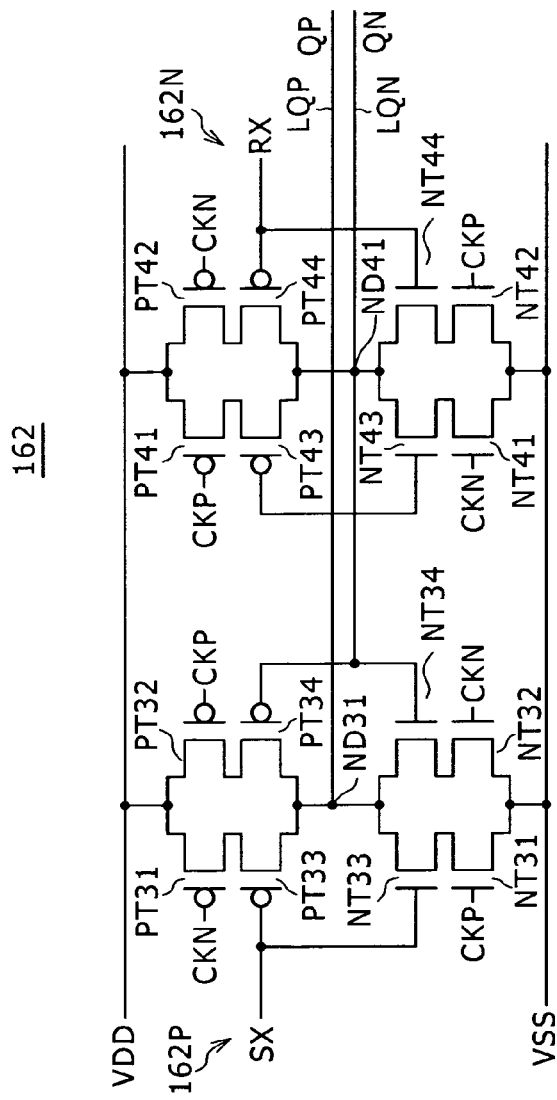
FIG. 11 is a circuit diagram showing a typical configuration of an output selection circuit according to the first embodiment of the present disclosure.

FIG. 11 is a circuit diagram showing a typical configuration of the output selection circuit 162 according to the first embodiment of the present disclosure.

Figure 12:
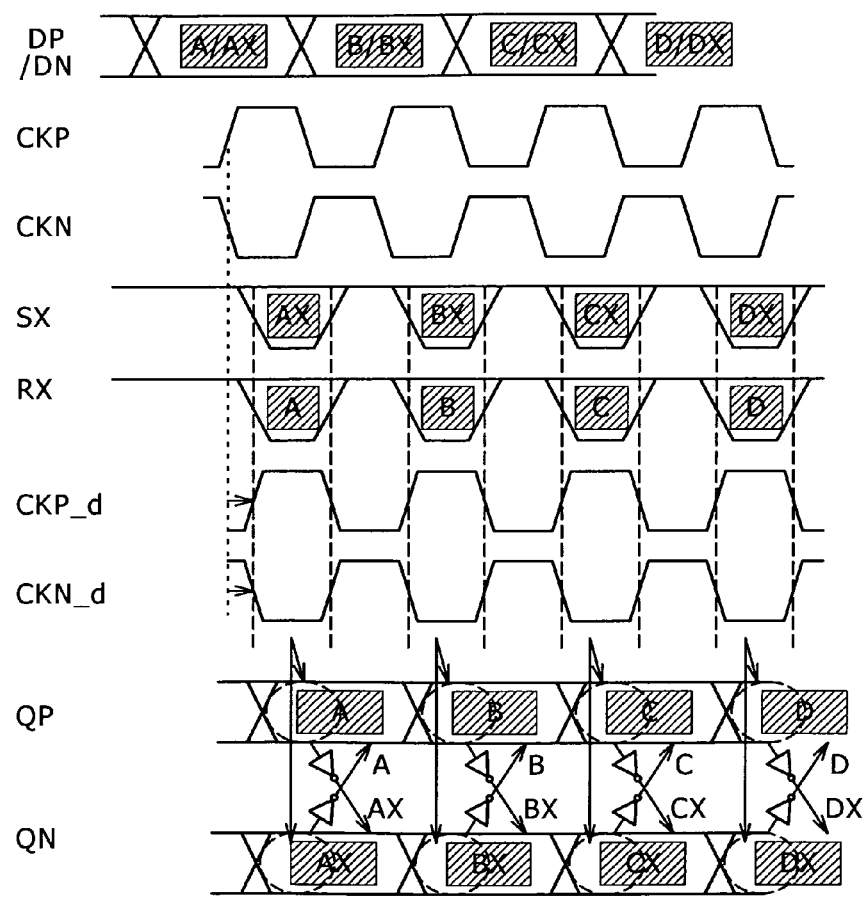
FIG. 12 shows timing charts of signals related to the differential DFF circuit according to the first embodiment of the present disclosure.

FIG. 12 shows timing charts of signals related to the differential DFF circuit according to the first embodiment.

As shown in FIG. 11, the output selection circuit 162 has 2 output selection circuits, that is, output selection circuits 162P and 162N. The first input terminal of first output selection section 162P receives the signal SX whereas the second input terminal of first output selection section 162P receives a signal output by the second output selection section 162N to form a cross-coupling connection. On the other hand, the first input terminal of second output selection section 162N receives the signal RX whereas the second input terminal of second output selection section 162N receives a signal output by the first output selection section 162P to form the cross-coupling connection.

The first output selection section 162P is configured to include PMOS transistors PT31 to PT34, NMOS transistors NT31 to NT34 and an output node ND31.

On the other hand, the second output selection section 162N is configured to include PMOS transistors PT41 to PT44, NMOS transistors NT41 to NT44 and an output node ND41.

In the first output selection section 162P, the sources of the PMOS transistors PT31 and PT32 are connected to the power-supply electric-potential line VDD whereas the sources of the NMOS transistors PT31 and PT32 are connected to the reference electric-potential line VSS.

The drain of the PMOS transistor PT31 is connected to the source of the PMOS transistor PT33 whereas the drain of the PMOS transistor PT33 is connected to the output node ND31. On the other hand, the drain of the PMOS transistor PT32 is connected to the source of the PMOS transistor PT34 whereas the drain of the PMOS transistor PT34 is connected to the output node ND31.

In addition, the drain of the NMOS transistor NT31 is connected to the source of the NMOS transistor NT33 whereas the drain of the NMOS transistor NT33 is connected to the output node ND31. On the other hand, the drain of the NMOS transistor NT32 is connected to the source of the NMOS transistor NT34 whereas the drain of the NMOS transistor NT34 is connected to the output node ND31.

A clock signal CKN is supplied to the gate of the PMOS transistor PT31 and the gate of the NMOS transistor NT32. On the other hand, a clock signal CKP is supplied to the gate of the PMOS transistor PT32 and the gate of the NMOS transistor NT31.

In addition, the signal SX is supplied to the gate of the PMOS transistor PT33 and the gate of the NMOS transistor NT33.

The gate of the PMOS transistor PT34 and the gate of the NMOS transistor NT34 are connected to the output node ND41 of the second output selection section 162N to receive an output signal QN supplied to the output node ND41.

In the second output selection section 162N, the sources of the PMOS transistors PT41 and PT42 are connected to the power-supply electric-potential line VDD whereas the sources of the NMOS transistors PT41 and PT42 are connected to the reference electric-potential line VSS.

The drain of the PMOS transistor PT41 is connected to the source of the PMOS transistor PT43 whereas the drain of the PMOS transistor PT43 is connected to the output node ND41. On the other hand, the drain of the PMOS transistor PT42 is connected to the source of the PMOS transistor PT44 whereas the drain of the PMOS transistor PT44 is connected to the output node ND41.

In addition, the drain of the NMOS transistor NT41 is connected to the source of the NMOS transistor NT43 whereas the drain of the NMOS transistor NT43 is connected to the output node ND41. On the other hand, the drain of the NMOS transistor NT42 is connected to the source of the NMOS transistor NT44 whereas the drain of the NMOS transistor NT44 is connected to the output node ND41.

The clock signal CKP is supplied to the gate of the PMOS transistor PT41 and the gate of the NMOS transistor NT42. On the other hand, the clock signal CKN is supplied to the gate of the PMOS transistor PT42 and the gate of the NMOS transistor NT41.

In addition, the signal RX is supplied to the gate of the PMOS transistor PT44 and the gate of the NMOS transistor NT44.

The gate of the PMOS transistor PT43 and the gate of the NMOS transistor NT43 are connected to the output node ND31 of the first output selection section 162P to receive an output signal QP.

Here, if the clock signal CKP and the clock signal CKN are supplied at the H and L levels respectively whereas the signal SX and the signal RX are supplied at the H and L levels respectively, the output selection circuit 162 operates as follows.

Since the clock signal CKP is supplied at the H level, in the first output selection section 162P, the PMOS transistor PT32 is turned off but the NMOS transistor NT31 is turned on. In addition, in the second output selection section 162N, the PMOS transistor PT41 is turned off but the NMOS transistor NT42 is turned on.

Since the clock signal CKN is supplied at the L level, on the other hand, in the first output selection section 162P, the PMOS transistor PT31 is turned on but the NMOS transistor NT32 is turned off. In addition, in the second output selection section 162N, the PMOS transistor PT42 is turned on but the NMOS transistor NT41 is turned off.

If the signal SX is supplied at the H level, in the first output selection section 162P, the PMOS transistor PT33 is turned off but the NMOS transistor NT33 is turned on. When the PMOS transistor PT33 is turned off but the NMOS transistor NT33 is turned on, in the first output selection section 162P, the output node ND31 is connected to the reference electric-potential line VSS by the NMOS transistors NT31 and NT33 and electrically discharged to the L level. At that time, the output node ND31 is disconnected from the power-supply electric-potential line VDD due to the fact that the PMOS transistors PT32 and PT33 are turned off.

When the output node ND31 is set at the L level, in the second output selection section 162N, the PMOS transistor PT43 is turned on but the NMOS transistor NT43 is turned off.

If the signal RX is supplied at the L level, in the second output selection section 162N, the PMOS transistor PT44 is turned on but the NMOS transistor NT44 is turned off. When the PMOS transistor PT44 is turned on but the NMOS transistor NT44 is turned off, in the second output selection section 162N, the output node ND41 is connected to the power-supply electric-potential line VDD by the PMOS transistors PT42 and PT44 and electrically charged to the H level. At that time, the output node ND41 is disconnected from the reference electric-potential line VSS due to the fact that the NMOS transistors NT41, NT43 and NT44 are turned off.

When the output node ND41 is set at the H level, in the first output selection section 162P, the PMOS transistor PT34 is turned off but the NMOS transistor NT34 is turned on.

In this case, the output signal QP is output at the L level whereas the output signal QN is output at the H level.

Here, if the clock signal CKP and the clock signal CKN are supplied at the H and L levels respectively whereas the signal SX and the signal RX are supplied at the L and H levels respectively, the output selection circuit 162 operates as follows.

Since the clock signal CKP is supplied at the H level, in the first output selection section 162P, the PMOS transistor PT32 is turned off but the NMOS transistor NT31 is turned on. In addition, in the second output selection section 162N, the PMOS transistor PT41 is turned off but the NMOS transistor NT42 is turned on.

Since the clock signal CKN is supplied at the L level, on the other hand, in the first output selection section 162P, the PMOS transistor PT31 is turned on but the NMOS transistor NT32 is turned off. In addition, in the second output selection section 162N, the PMOS transistor PT42 is turned on but the NMOS transistor NT41 is turned off.

If the signal SX is supplied at the L level, in the first output selection section 162P, the PMOS transistor PT33 is turned on but the NMOS transistor NT33 is turned off. When the PMOS transistor PT33 is turned on but the NMOS transistor NT33 is turned off, in the first output selection section 162P, the output node ND31 is connected to the power-supply electric-potential line VDD by the PMOS transistors PT31 and PT33 and electrically charged to the H level. At that time, the output node ND31 is disconnected from the reference electric-potential line VSS due to the fact that the NMOS transistors NT32 and NT33 are turned off.

When the output node ND31 is set at the H level, in the second output selection section 162N, the PMOS transistor PT43 is turned off but the NMOS transistor NT43 is turned on.

If the signal RX is supplied at the H level, in the second output selection section 162N, the PMOS transistor PT44 is turned off but the NMOS transistor NT44 is turned on. When the PMOS transistor PT44 is turned off but the NMOS transistor NT44 is turned on, in the second output selection section 162N, the output node ND41 is connected to the reference electric-potential line VSS by the NMOS transistors NT42 and NT44 and electrically discharged to the L level. At that time, the output node ND41 is disconnected from the power-supply electric-potential line VDD due to the fact that the PMOS transistors PT41, PT43 and PT44 are turned off.

When the output node ND41 is set at the L level, in the first output selection section 162P, the PMOS transistor PT34 is turned on but the NMOS transistor NT34 is turned off.

In this case, the output signal QP is output at the H level whereas the output signal QN is output at the L level.

If the clock signal CKP and the clock signal CKN are supplied at the L and H levels respectively, the same operations as what has been described above are carried out.

The output selection circuit 162 described above has a configuration for selecting the held data of the output signal QP having a phase opposite to the phase of the signal SX output by the latched comparator circuit 161 or the held data of the output signal QN having a phase opposite to the phase of the signal RX also output by the latched comparator circuit 161.

With the clock signal CKP set at the H level (CKP=H) and, hence, with the clock signal CKN set at the L level (CKN=L), the first output selection section 162P on a side inputting the signal SX outputs the inverted signal of the signal SX as the output signal QP but, with the clock signal CKN set at the H level (CKN=H) and, hence, with the clock signal CKP set at the L level (CKP=L), on the other hand, the first output selection section 162P outputs the inverted signal of the output signal QN as the output signal QP.

With the clock signal CKP set at the H level (CKP=H) and, hence, with the clock signal CKN set at the L level (CKN=L), the second output selection section 162N on a side inputting the signal RX outputs the inverted signal of the signal RX as the output signal QN but, with the clock signal CKN set at the H level (CKN=H) and, hence, with the clock signal CKP set at the L level (CKP=L), on the other hand, the second output selection section 162N outputs the inverted signal of the output signal QP as the output signal QN.

<2. Second Embodiment>

Figure 13:
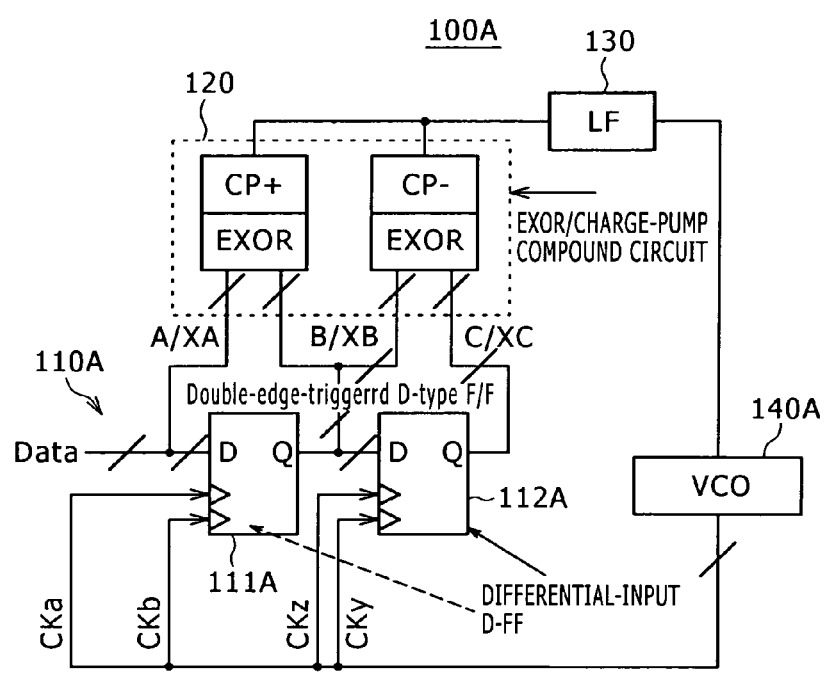
FIG. 13 is a diagram showing the configuration of a CDR circuit according to a second embodiment of the present disclosure.

FIG. 13 is a diagram showing the configuration of a CDR circuit 100A according to a second embodiment of the present disclosure.

In the CDR circuit 100 according to the first embodiment of the present disclosure, each of the DFF circuits is a typical circuit driven by a clock signal supplied at the full rate. However, even if the clock signal is supplied to the DFF circuit at a half rate, the DFF circuit also operates as well.

Differences between the CDR circuit 100 according to the first embodiment and the CDR circuit 100A according to the second embodiment are explained as follows.

In the CDR circuit 100A according to the second embodiment, the VCO 140A is a multiphase VCO for generating 4 clock signals CKa, CKz, CKb and CKy with phases shifted from each other by 90 degrees.

Thus, the oscillation frequency of the VCO 140A employed in the CDR circuit 100A according to the second embodiment can be half the oscillation frequency of the VCO 140 employed in the CDR circuit 100 according to the first embodiment. As a result, it is relatively easy to manufacture the VCO 140A.

In addition, in the phase detector 110A employed in the CDR circuit 100A according to the second embodiment, each of the first DFF 111A and the second DFF 112A is a DFF circuit having a double-edge trigger type.

Figure 14:
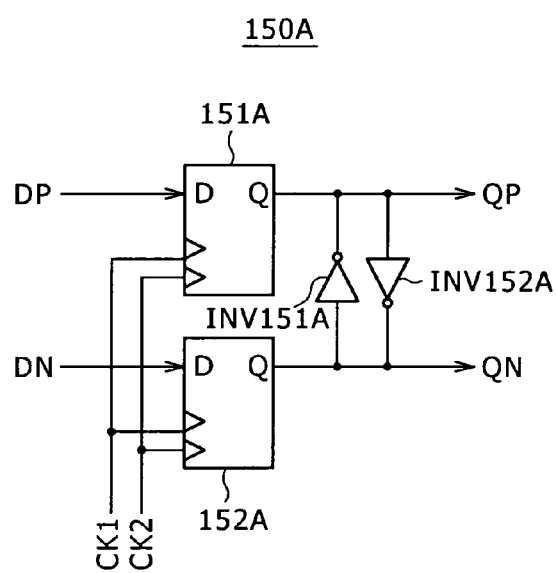
FIG. 14 is a circuit diagram showing a typical configuration of a differential DFF circuit according to the second embodiment of the present disclosure.

FIG. 14 is a circuit diagram showing a typical configuration of a differential DFF circuit 150A according to the second embodiment of the present disclosure.

In the figure showing the typical configuration of the differential DFF circuit 150A, a signal representing the input data on the positive side is denoted by notation DP whereas a signal representing the input data on the negative side is denoted by notation DN. In addition, clock signals are denoted by notations CK1 and CK2.

The differential DFF circuit 150A is configured to include 2 double-edge trigger DFF circuits, that is, a double-edge trigger DFF circuit 151A for receiving the input data DP and a double-edge trigger DFF circuit 152A for receiving the input data DN. In this configuration, the double-edge trigger DFF circuit 151A and the double-edge trigger DFF circuit 152A are laid out to form an array.

In addition, inverters INV151A and INV152A are connected to serve as cross-coupling inverters between an output line for conveying a signal QP output by the double-edge trigger DFF circuit 151A and an output line for conveying a signal QN output by the double-edge trigger DFF circuit 152A. To put it in detail, the output terminal of the inverter INV151A and the input terminal of the inverter INV152A are connected to the output line for conveying the signal QP output by the double-edge trigger DFF circuit 151A from the data output terminal Q of the double-edge trigger DFF circuit 151A. By the same token, the input terminal of the inverter INV151A and the output terminal of the inverter INV152A are connected to the output line for conveying the signal QN output by the double-edge trigger DFF circuit 152A from the data output terminal Q of the double-edge trigger DFF circuit 152A.

As described above, the differential DFF circuit 150A shown in FIG. 14 can be implemented by laying out 2 double-edge trigger DFF circuits for receiving the input data DP and the input data DN respectively to form a parallel circuit.

By further connecting the inverter INV151A and the inverter INV152A serving as cross-coupling inverters at the output stage, the differential balance can be improved.

Figure 15:
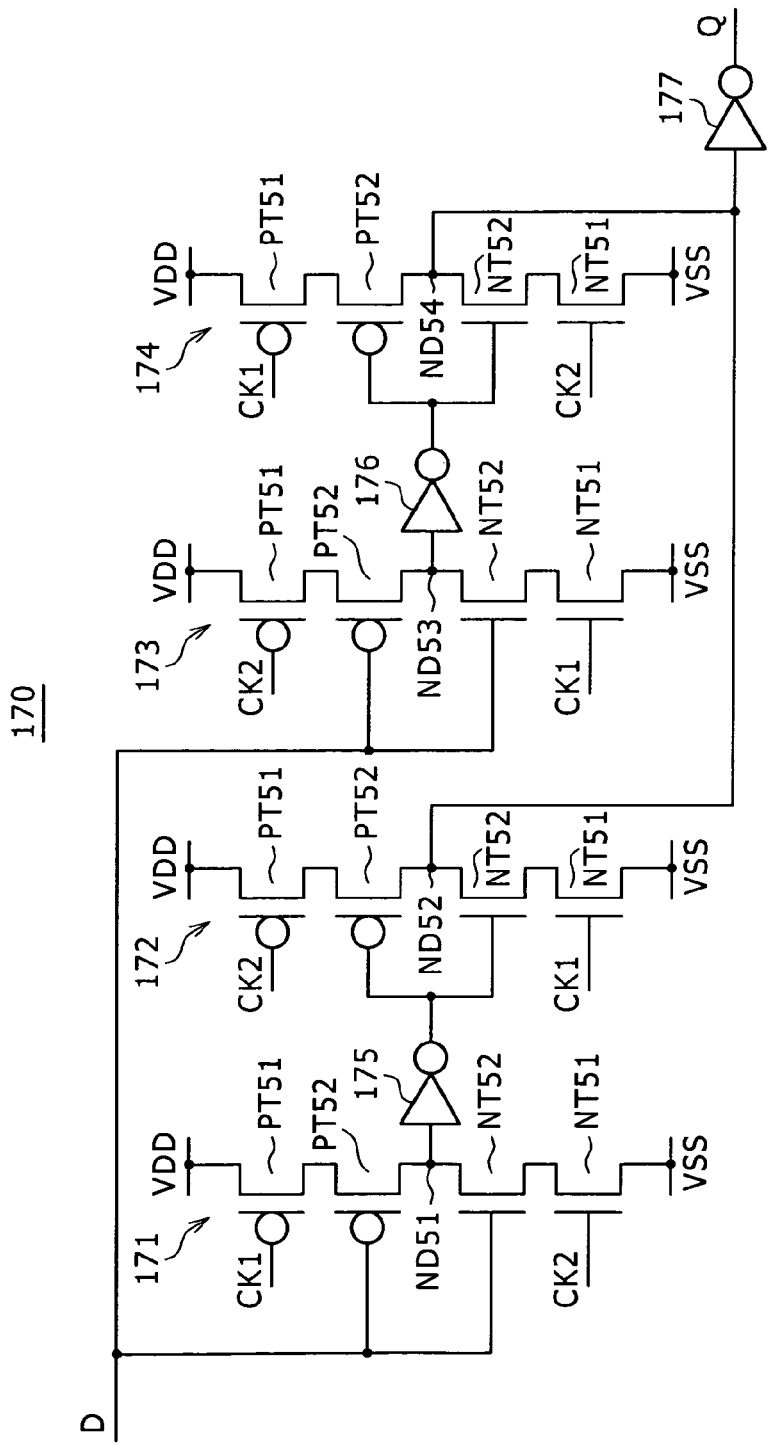
FIG. 15 is a circuit diagram showing a typical configuration of a double-edge trigger DFF circuit.

FIG. 15 is a circuit diagram showing a typical configuration of a double-edge trigger DFF circuit 170.

As shown in FIG. 15, the double-edge trigger DFF circuit 170 has 4 clocked inverters, that is, clocked inverters 171 to 174, and ordinary inverters 175 to 177.

Each of the clocked inverters 171 to 174 includes PMOS transistors PT51 and PT52 as well as NMOS transistors NT51 and NT52. The PMOS transistor PT51, the PMOS transistor PT52, the NMOS transistor NT52 and the NMOS transistor NT51 are connected to each other to form a series circuit between the power-supply electric-potential line VDD and the reference electric-potential line VSS.

In the clocked inverter 171, the drain of the PMOS transistor PT52 and the drain of the NMOS transistor NT52 are connected to a connection node ND51. By the same token, in the clocked inverter 172, the drain of the PMOS transistor PT52 and the drain of the NMOS transistor NT52 are connected to a connection node ND52. In the same way, in the clocked inverter 173, the drain of the PMOS transistor PT52 and the drain of the NMOS transistor NT52 are connected to a connection node ND53. Likewise, in the clocked inverter 174, the drain of the PMOS transistor PT52 and the drain of the NMOS transistor NT52 are connected to a connection node ND54.

In the clocked inverter 171, the gate of the PMOS transistor PT51 receives a clock signal CK1 whereas the gate of the NMOS transistor NT51 receives a clock signal CK2.

In the clocked inverter 171, the gate of the PMOS transistor PT52 and the gate of the NMOS transistor NT52 are connected to a D input terminal.

The connection node ND51 of the clocked inverter 171 is connected by the inverter 175 to the gates of the PMOS transistor PT52 and the NMOS transistor NT52 which are employed in the clocked inverter 172.

In the clocked inverter 172, the gate of the PMOS transistor PT51 receives the clock signal CK2 whereas the gate of the NMOS transistor NT51 receives the clock signal CK1.

The connection node ND52 of the clocked inverter 172 is connected by the inverter 177 to a Q output terminal.

In the clocked inverter 173, the gate of the PMOS transistor PT51 receives the clock signal CK2 whereas the gate of the NMOS transistor NT51 receives the clock signal CK1.

In the clocked inverter 173, the gate of the PMOS transistor PT52 and the gate of the NMOS transistor NT52 are connected to the D input terminal.

The connection node ND53 of the clocked inverter 173 is connected by the inverter 176 to the gates of the PMOS transistor PT52 and the NMOS transistor NT52 which are employed in the clocked inverter 174.

In the clocked inverter 174, the gate of the PMOS transistor PT51 receives the clock signal CK1 whereas the gate of the NMOS transistor NT51 receives the clock signal CK2.

The connection node ND54 of the clocked inverter 174 is connected by the inverter 177 to the Q output terminal.

Both the rising and falling edges of each of the input clock signals CK1 and CK2 which are complementary to each other are used as a trigger to take the value of a D input from the D input terminal and generate the value of a Q output at the Q output terminal.

Figure 16:
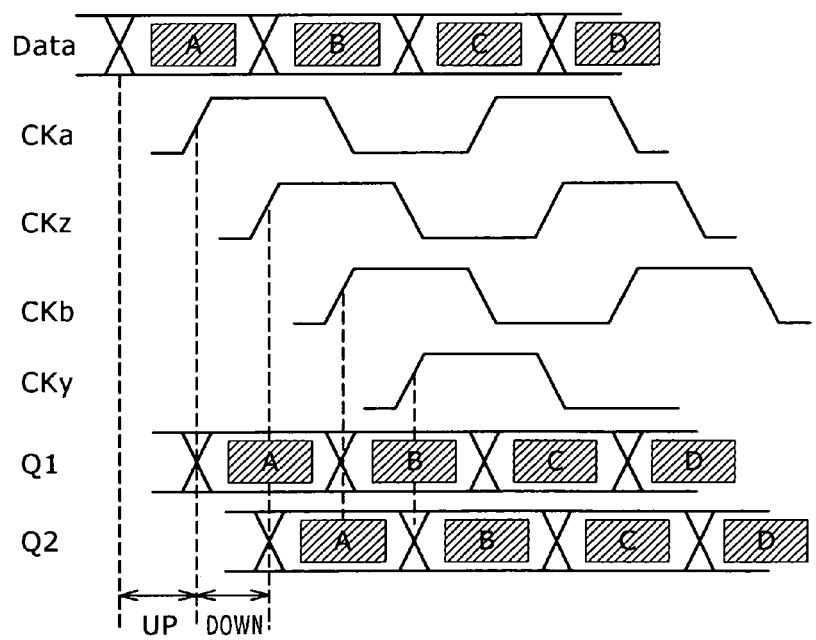
FIG. 16 shows timing charts of input data, VCO clock signals and output retimed data in the second embodiment.

FIG. 16 shows timing charts of the input data, the VCO clock signals and output retimed data in the second embodiment.

The VCO 140A generates 4 clock signals CKa, CKz, CKb and CKy with phases shifted from each other by 90 degrees. On the rising edges of the clock signals CKa, CKz, CKb and CKy, the CDR circuit 100A samples respectively the vicinities of the eye center of the input data IDT, the eye edge of the input data IDT, the eye center of data following the input data IDT and the eye edge of the data following the input data IDT.

The values taken synchronously with the clock signals CKa and CKb become retimed data RTDT. On the other hand, the values taken synchronously with the clock signals CKz and CKy are logically compared with the values taken at the preceding and succeeding eye centers in order to generate the up signal UP and the down signal DOWN.

Figure 17:
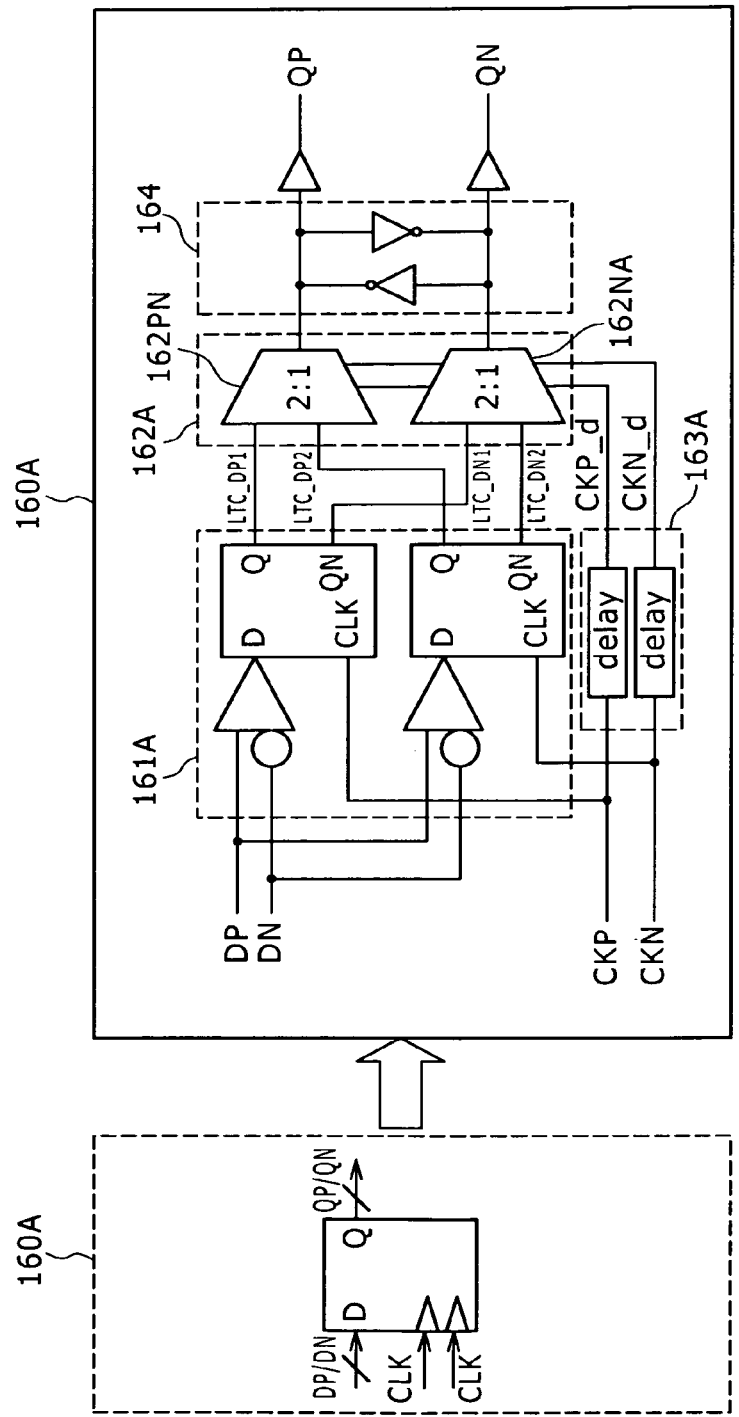
FIG. 17 is a circuit diagram showing another typical configuration of the differential DFF circuit according to the second embodiment of the present disclosure.

FIG. 17 is a circuit diagram showing a typical configuration of another differential DFF circuit 160A according to the second embodiment of the present disclosure.

Figure 18:
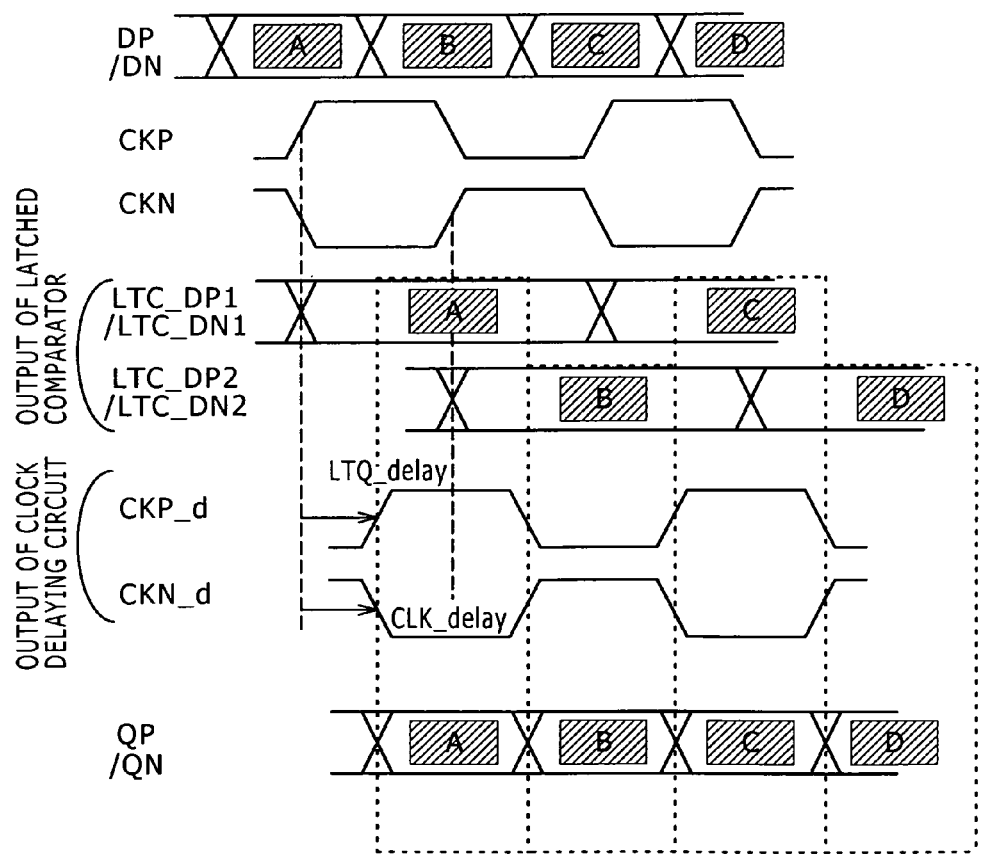
FIG. 18 shows timing charts of signals related to the differential DFF circuit shown in FIG. 17.

FIG. 18 shows timing charts of signals related to the differential DFF circuit 160A shown in FIG. 17.

As shown in FIG. 17, the differential DFF circuit 160A is configured as a combination including a latched comparator circuit 161A, an output selection circuit 162A, a clock delaying circuit 163A and a cross-coupled inverter 164.

The latched comparator circuit 161A receives differential inputs DP and DN typically in synchronization with a clock signal CKP. The latched comparator circuit 161A compares the differential inputs DP and DN with each other and carries out latching processing on the inputs DP and DN. The latched comparator circuit 161A outputs signals LTC_DP1, LTC_DP2, LTC_DN1 and LTC_DN2 representing the results of the processing to the output selection circuit 162A.

The output selection circuit 162A selects held data of an output signal QN or QP and outputs the held data synchronously with a clock signal CKP or CKN delayed by the clock delaying circuit 163A. The phase of the output signal QP is opposite to the phase of the input signal DP supplied to the latched comparator circuit 161A whereas the phase of the output signal QN is opposite to the phase of the input signal DN supplied to the latched comparator circuit 161A.

The output selection circuit 162A has 2 output selection circuits, that is, output selection circuits 162PA and 162NA. The first input terminal of the output selection circuit 162PA receives the first input signal LTC_DP1 whereas the second input terminal of the output selection circuit 162PA receives the second input signal LTC_DP2. On the other hand, the first input terminal of the output selection circuit 162NA receives the first input signal LTC_DN1 whereas the second input terminal of the output selection circuit 162NA receives the second input signal LTC_DN2.

The clock delaying circuit 163A delays the clock signals CKP and CKN by typically at least a delay time equal to the time it takes to carry out the processing of the latched comparator circuit 161A and outputs the delayed clock signals CKP and CKN to the output selection circuit 162A.

The cross-coupled inverter 164 is capable of improving the differential balance at the output terminals of the cross-coupled inverter 164.

As described above, the differential DFF circuit 160A shown in FIG. 17 is a double-edge trigger circuit capable of operating at half the clock rate.

The latched comparator circuit 161A is configured to include a first latched comparator circuit 1611 for inputting data on the rising edge of the clock signal CLKP and a second latched comparator circuit 1622 for inputting data on the rising edge of the clock signal CLKN.

In addition, the differential DFF circuit 160A includes the output selection circuit 162A for sequentially fetching the signals LTC_DP1, LTC_DP2, LTC_DN1 and LTC_DN2, which are output by the latched comparator circuit 161A, in synchronization with clock signals CKP_d and CKN_d generated by the clock delaying circuit 163A after the signals LTC_DP1, LTC_DP2, LTC_DN1 and LTC_DN2 have become stable in order to restore the speed to the full rate.

On top of that, the differential DFF circuit 160A also includes the cross-coupled inverter 164 capable of improving the differential balance at the output terminals of the cross-coupled inverter 164.

Figure 19:
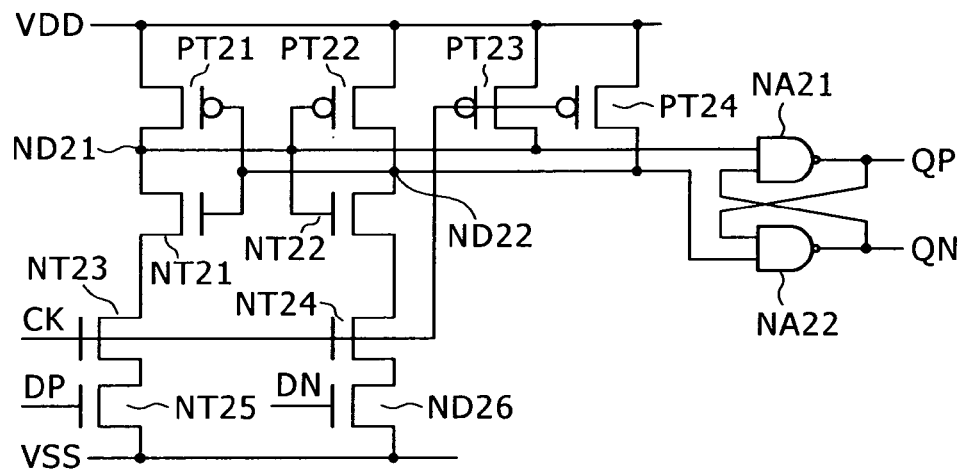
FIG. 19 is a circuit diagram showing a typical configuration of a latched comparator circuit according to the second embodiment of the present disclosure.

FIG. 19 is a circuit diagram showing a typical configuration of the latched comparator circuit 161A according to the second embodiment of the present disclosure.

As shown in FIG. 19, in comparison with the latched comparator circuit 161 shown in FIG. 10, the latched comparator circuit 161A is provided with 2-input NAND gates NA21 and NA22 at the output stage of the latched comparator circuit 161A.

The first input terminal of the NAND gate NA21 is connected to the first output node ND21 whereas the second input terminal of the NAND gate NA21 is connected to the output terminal of the NAND gate NA22.

On the other hand, the first input terminal of the NAND gate NA22 is connected to the second output node ND22 whereas the second input terminal of the NAND gate NA22 is connected to the output terminal of the NAND gate NA21.

Since the rest of the latched comparator circuit 161A is identical with the latched comparator circuit 161 shown in FIG. 9, the detailed explanation of the rest is not repeated.

In the latched comparator circuit 161A, after one of the 2 signals QP and QN output by the latched comparator circuit 161A has been set at the H level, the other signal is set at the L level. That is to say, the configuration of the latched comparator circuit 161A includes an excessive stage at which NAND gates NA21 and NA22 are provided. Thus, there is a difference in delay between the 2 signals QP and QN output by the latched comparator circuit 161A. For this reason, the latched comparator circuit 161A is designed into a configuration in which the delayed clock signals generated by the clock delaying circuit 163A as described above are used for eliminating the difference in delay.

Figure 20:
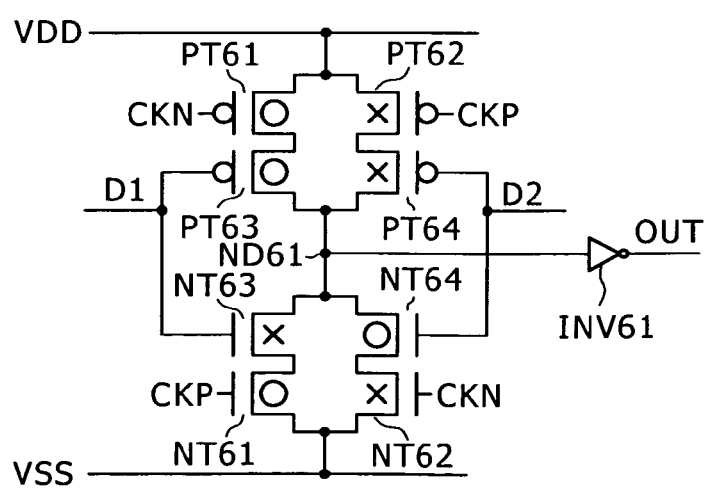
FIG. 20 is a circuit diagram showing a typical configuration of an output selection circuit according to the second embodiment of the present disclosure.

FIG. 20 is a circuit diagram showing a typical configuration of the output selection circuit 162A according to the second embodiment of the present disclosure.

The output selection circuit 162A shown in FIG. 20 is configured to select the value of an input signal D1 or D2 and output the selected value by making use of clock signals CPK and CKN which are complementary to each other.

The basic configuration of the output selection circuit 162A shown in FIG. 20 is identical with the configuration of the output selection circuit 162 shown in FIG. 11.

As shown in FIG. 20, the output selection circuit 162A is configured to include PMOS transistors PT61 to PT64, NMOS transistors NT61 to NT64, an inverter INV61 and an output node ND61.

The source of the PMOS transistor PT61 and the source of the PMOS transistor PT62 are connected to the power-supply electric-potential line VDD whereas the source of the NMOS transistor NT61 and the source of the NMOS transistor NT62 are connected to the reference electric-potential line VSS.

The drain of the PMOS transistor PT61 is connected to the source of the PMOS transistor PT63 whereas the drain of the PMOS transistor PT63 is connected to the output node ND61. The drain of the PMOS transistor PT62 is connected to the source of the PMOS transistor PT64 whereas the drain of the PMOS transistor PT64 is connected to the output node ND61.

The drain of the NMOS transistor NT61 is connected to the source of the NMOS transistor NT63 whereas the drain of the NMOS transistor NT63 is connected to the output node ND61. The drain of the NMOS transistor NT62 is connected to the source of the NMOS transistor NT64 whereas the drain of the NMOS transistor NT64 is connected to the output node ND61.

In addition, the gate of the PMOS transistor PT61 and the gate of the NMOS transistor NT62 receive the clock signal CKN whereas the gate of the PMOS transistor PT62 and the gate of the NMOS transistor NT61 receive the clock signal CKP.

On top of that, the gate of the PMOS transistor PT63 and the gate of the NMOS transistor NT63 receive the signal D1

The gate of the PMOS transistor PT64 and the gate of the NMOS transistor NT64 receive the signal D2.

Here, if the clock signal CKP is supplied at the H level, the clock signal CKN is supplied at the L level, the signal D1 is supplied at the H level and the signal D2 is supplied at the L level, the output selection circuit 162A operates as follows.

Since the clock signal CKP is supplied at the H level, the PMOS transistor PT62 is turned off but the NMOS transistor NT61 is turned on.

Since the clock signal CKN is supplied at the L level, the PMOS transistor PT61 is turned on but the NMOS transistor NT62 is turned off.

Since the signal D1 is supplied at the H level, the PMOS transistor PT63 is turned off but the NMOS transistor NT63 is turned on.

Since the signal D2 is supplied at the L level, the PMOS transistor PT64 is turned on but the NMOS transistor NT64 is turned off.

Accompanying the operations described above, the output node ND61 is connected to the reference electric-potential line VSS by the NMOS transistors NT61 and NT63 and electrically discharged to the L level. At that time, the output node ND61 is disconnected from the power-supply electric-potential line VDD due to the fact that the PMOS transistors PT62 and PT63 are turned off.

When the output node ND61 is set at the L level, the inverter INV61 outputs a signal at the H level.

If the clock signal CKP is supplied at the H level, the clock signal CKN is supplied at the L level, the signal D1 is supplied at the L level and the signal D2 is supplied at the H level, the output selection circuit 162A operates as follows.

Since the clock signal CKP is supplied at the H level, the PMOS transistor PT62 is turned off but the NMOS transistor NT61 is turned on.

Since the clock signal CKN is supplied at the L level, the PMOS transistor PT61 is turned on but the NMOS transistor NT62 is turned off.

Since the signal D1 is supplied at the L level, the PMOS transistor PT63 is turned on but the NMOS transistor NT63 is turned off.

Since the signal D2 is supplied at the H level, the PMOS transistor PT64 is turned off but the NMOS transistor NT64 is turned on.

Accompanying the operations described above, the output node ND61 is connected to the power-supply electric-potential line VDD by the PMOS transistors PT61 and PT63 and electrically charged to the H level. At that time, the output node ND61 is disconnected from the reference electric-potential line VSS due to the fact that the NMOS transistors NT62 and NT63 are turned off.

When the output node ND61 is set at the H level, the inverter INV61 outputs a signal at the L level.

If the clock signal CKP is supplied at the L level and the clock signal CKN is supplied at the H level, similar operations are carried out by the output selection circuit 162A.

The output selection circuit 162A is configured to select the value of the signal D1 or D2 by making use of the clock signals CPK and CKN which are complementary to each other.

As described above, in accordance with the embodiments, EXOR circuits are integrated with a changeover switch of every charge-pump circuit to form the EXOR/charge-pump compound circuit 120. The EXOR circuits are circuits for generating respectively an up signal UP and a down signal DOWN from the Hogge-type phase detector 110. The up signal UP is an electrical charging current of a specific one of the charge-pump circuits whereas the down signal DOWN is an electrical discharging current of the other one of the charge-pump circuits. The changeover switches are each a switch for changing the current generated from the Hogge-type phase detector 110 from the up signal UP of the specific charge-pump circuit to the down signal DOWN of the other charge-pump circuit and vice versa.

In addition, in the Hogge-type phase detector 110 employed in the CDR circuit 100, a first DFF 111 and a second DFF 112 are each configured as a DFF included in a DFF circuit for generating differential outputs having the same phase. Each of the DFF circuits provides the generated differential outputs to one of EXOR circuits 115 and 116 as differential inputs of the EXOR circuit.

As described above, in accordance with the embodiments, by making use of the EXOR/charge-pump compound circuit 120 as well as the differential-input DFF circuits, it is possible to implement a Hogge phase comparator capable of operating at a high speed. In addition, it is also possible to implement DFF circuits each having uniform QP and QN level transitions without consuming much power as is the case with a source-couple differential circuit.

It is to be noted that implementations of the present disclosure are by no means limited to the embodiments described above. That is to say, the embodiments can be further changed to a variety of modified versions within a range not deviating from essentials of the present disclosure.

The present disclosure contains subject matter related to that disclosed in Japanese Priority Patent Application JP 2010-223836 filed in the Japan Patent Office on Oct. 1, 2010, the entire content of which is hereby incorporated by reference.

What is claimed is:

1. A phase comparator comprising:

a first latch configured to latch input data synchronously with an eye center clock signal;

a second latch configured to latch said data latched in said first latch synchronously with an eye edge center clock signal having a phase opposite to the phase of said eye center clock signal;

a first detection circuit configured to detect logical mismatching of said input data and said data latched in said first latch;

a second detection circuit configured to detect logical mismatching of said data latched in said first latch and said data latched in said second latch; and a charge-pump circuit having the function of a changeover switch configured to change a current generated by said charge-pump circuit from an electrical charging current to an electrical discharging current and vice versa on the basis of logical-mismatching detection results produced by said first and second detection circuits, wherein said first detection circuit, said second detection circuit and said charge-pump circuit are formed as a mismatching-detector/charge-pump compound circuit which is a compound circuit including logical-mismatching determination sections of said first and second detection circuits and said changeover switch configured to change said current from said electrical charging current of said charge-pump circuit to said electrical discharging current of said charge-pump circuit and vice versa, said mismatching-detector/charge-pump compound circuit includes, an output node, a first compound section and a first current source connected to said first compound section in series between a power supply and said output node, and a second compound section and a second current source connected to said second compound section in series between said output node and a reference electric potential line.

2. The phase comparator according to claim 1 wherein:

said logical-mismatching determination section includes differential inputs; and said first and second latches are formed as flip-flop circuits having differential outputs with the same phase.

3. The phase comparator according to claim 1 wherein:

said first compound section has a first to fourth first-conduction transistors, in said first compound section, the source of said first first-conduction transistor is connected to the source of said second first-conduction transistor through a first connection point wired to said power supply, the drain of said third first-conduction transistor is connected to the drain of said fourth first-conduction transistor through a second connection point wired to said output node, the drain of said first-conduction transistor is connected to the source of said third first-conduction transistor, the drain of said second first-conduction transistor is connected to the source of said fourth first-conduction transistor, the gate of said first first-conduction transistor receives said input data, the gate of said second first-conduction transistor receives data having a phase opposite to the phase of said input data, the gate of said third first-conduction transistor receives data having a phase opposite to the phase of data latched in said first latch, and the gate of said fourth first-conduction transistor receives said data latched in said first latch, said second compound section has a first to fourth second-conduction transistors, and in said second compound section, the source of said first second-conduction transistor is connected to the source of said second second-conduction transistor through a third connection point wired to said reference electric potential line, the drain of said third second-conduction transistor is connected to the drain of said fourth second-conduction transistor through a fourth connection point wired to said output node, the drain of said first second-conduction transistor is connected to the source of said third second-conduction transistor, the drain of said second second-conduction transistor is connected to the source of said fourth second-conduction transistor, the gate of said first second-conduction transistor receives data latched in said second latch, the gate of said second second-conduction transistor receives data having a phase opposite to the phase of said data latched in said second latch, the gate of said third second-conduction transistor receives data having a phase opposite to the phase of said data latched in said first latch, and the gate of said fourth Second-conduction transistor receives said data latched in said first latch.

4. The phase comparator according to claim 1 wherein said first and second latches each latch data synchronously with a full-rate clock signal.

5. The phase comparator according to claim 1 wherein said first and second latches each latch data synchronously with a half-rate clock signal.

6. A clock data recovery circuit comprising:

a phase comparator configured to detect a difference in phase between input data and an extracted clock signal and outputting an analog quantity according to said difference in phase;

a loop filter configured to integrate and smoothing a signal output by said phase comparator; and a voltage-controlled oscillator configured to generate said clock signal by oscillation at a frequency according to a signal output by said loop filter and supplying said clock signal to said phase comparator, wherein said phase comparator includes, a first latch configured to latch said input data synchronously with an eye center clock signal, a second latch configured to latch said data latched in said first latch synchronously with an eye edge center clock signal having a phase opposite to said phase of said eye center clock signal, a first detection circuit configured to detect logical mismatching of said input data and said data latched in said first latch, a second detection circuit configured to detect logical mismatching of said data latched in said first latch and said data latched in said second latch, and a charge-pump circuit having the function of a changeover switch configured to change a current output by said charge-pump circuit to said loop filter from an electrical charging current to an electrical discharging current and vice versa on said basis of logical-mismatching detection results produced by said first and second detection circuits, and said first detection circuit, said second detection circuit and said charge-pump circuit are formed as a mismatching-detector/charge-pump compound circuit which is a compound circuit including logical-mismatching determination sections of said first and second detection circuits and including said changeover switch configured to change said current from said electrical charging current of said charge-pump circuit to said electrical discharging current of said charge-pump circuit and vice versa, said mismatching-detector/charge-pump compound circuit includes, an output node, a first compound section and a first current source connected to said first compound section in series between a power supply and said output node, and a second compound section and a second current source connected to said second compound section in series between said output node and a reference electric potential line.

7. The clock data recovery circuit according to claim 6 wherein:

said logical-mismatching determination section includes differential inputs; and said first and second latches are formed as flip-flop circuits having differential outputs with the same phase.

8. The clock data recovery circuit according to claim 6 wherein:

said first compound section has a first to fourth first-conduction transistors, in said first compound section, the source of said first-conduction transistor is connected to the source of said second first-conduction transistor through a first connection point wired to said power supply, the drain of said third first-conduction transistor is connected to the drain of said fourth first-conduction transistor through a second connection point wired to said output node, the drain of said first-conduction transistor is connected to the source of said third first-conduction transistor, the drain of said second first-conduction transistor is connected to the source of said fourth first-conduction transistor, the gate of said first-conduction transistor receives said input data, the gate of said second first-conduction transistor receives data having a phase opposite to the phase of said input data, the gate of said third first-conduction transistor receives data having a phase opposite to the phase of data latched in said first latch, and the gate of said fourth first-conduction transistor receives said data latched in said first latch, said second compound section has a first to fourth second-conduction transistors, and in said second compound section, the source of said first second-conduction transistor is connected to the source of said second second-conduction transistor through a third connection point wired to said reference electric potential line, the drain of said third second-conduction transistor is connected to the drain of said fourth second-conduction transistor through a fourth connection point wired to said output node, the drain of said first second-conduction transistor is connected to the source of said third second-conduction transistor, the drain of said second second-conduction transistor is connected to the source of said fourth second-conduction transistor, the gate of said first second-conduction transistor receives data latched in said second latch, the gate of said second second-conduction transistor receives data having a phase opposite to the phase of said data latched in said second latch, the gate of said third second-conduction transistor receives data having a phase opposite to the phase of said data latched in said first latch, and the gate of said fourth second-conduction transistor receives said data latched in said first latch.

9. The clock data recovery circuit according to claim 6 wherein said first and second latches each latch data synchronously with a full-rate clock signal.

10. The clock data recovery circuit according to claim 6 wherein said first and second latches each latch data synchronously with a half-rate clock signal.

* * * * *